US009489326B1

(12) United States Patent
Maheshwari et al.

(10) Patent No.: US 9,489,326 B1
(45) Date of Patent: Nov. 8, 2016

(54) MULTI-PORT INTEGRATED CIRCUIT DEVICES AND METHODS

(75) Inventors: Dinesh Maheshwari, Fremont, CA (US); Anuj Chakrapani, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 616 days.

(21) Appl. No.: 12/757,614

(22) Filed: Apr. 9, 2010

Related U.S. Application Data

(63) Continuation-in-part of application No. 12/720,517, filed on Mar. 9, 2010.

(60) Provisional application No. 61/167,971, filed on Apr. 9, 2009, provisional application No. 61/158,676, filed on Mar. 9, 2009.

(51) Int. Cl.
*G06F 12/00* (2006.01)
*G06F 13/00* (2006.01)
*G06F 13/28* (2006.01)

(52) U.S. Cl.
CPC ..................... *G06F 13/28* (2013.01)

(58) Field of Classification Search
CPC .. G06F 13/28; G06F 13/4027; G06F 13/105; G06F 13/1684; G06F 13/385; G06F 13/40; G06F 13/4291; G06F 13/362; G06F 13/4059; G06F 13/4082; G11C 7/1075
USPC ........................................ 711/149
See application file for complete search history.

(56) References Cited

U.S. PATENT DOCUMENTS

| 3,961,312 | A | * | 6/1976 | Bodner | G06F 13/282 |
| | | | | | 710/25 |
| 4,995,001 | A | | 2/1991 | Dawson et al. | |
| 5,115,413 | A | | 5/1992 | Sato et al. | |
| 5,204,841 | A | | 4/1993 | Chappell et al. | |
| 5,319,603 | A | | 6/1994 | Watanabe et al. | |
| 5,561,780 | A | * | 10/1996 | Glew et al. | 711/126 |
| 5,646,893 | A | | 7/1997 | Mcminn et al. | |
| 5,657,287 | A | * | 8/1997 | McLaury | G11C 7/1021 |
| | | | | | 365/230.01 |
| 5,717,647 | A | | 2/1998 | Hush et al. | |
| 5,956,748 | A | | 9/1999 | New | |
| 6,058,439 | A | * | 5/2000 | Devereux | 710/52 |
| 6,127,843 | A | | 10/2000 | Agrawal et al. | |
| 6,134,180 | A | * | 10/2000 | Kim et al. | 365/233.16 |
| 6,185,630 | B1 | * | 2/2001 | Simmons | G06F 13/1605 |
| | | | | | 370/457 |
| 6,397,273 | B2 | | 5/2002 | Chilton | |
| 6,480,927 | B1 | * | 11/2002 | Bauman | 710/317 |
| 6,564,285 | B1 | * | 5/2003 | Mills et al. | 711/103 |
| 6,650,142 | B1 | | 11/2003 | Agrawal et al. | |

(Continued)

OTHER PUBLICATIONS

U.S. Appl. No. 12/720,517 "Multi-Port Memory Devices and Methods", filed Mar. 9, 2010; 51 pages.

(Continued)

*Primary Examiner* — Sheng-Jen Tsai
(74) *Attorney, Agent, or Firm* — Lowenstein Sandler LLP

(57) ABSTRACT

An integrated circuit device may include a first integrated circuit (IC) portion having a memory array that stores data units as storage locations and burst access circuitry that sequentially accesses N relates storage locations within the memory array, where N>1; and a second IC portion comprising a plurality of burst access registers coupled to the burst access circuitry, each burst access register having register locations to store at least N data units, and being coupled to a corresponding port by a single data unit access path.

20 Claims, 23 Drawing Sheets

(56) References Cited

U.S. PATENT DOCUMENTS

| | | | |
|---|---|---|---|
| 6,658,578 B1* | 12/2003 | Laurenti | G06F 5/01 |
| | | | 712/244 |
| 6,765,408 B2 | 7/2004 | Cheng et al. | |
| 7,047,284 B1* | 5/2006 | Agarwala et al. | 709/220 |
| 7,080,169 B2 | 7/2006 | Tang et al. | |
| 7,092,279 B1 | 8/2006 | Sheppard | |
| 7,130,942 B2 | 10/2006 | Gemelli et al. | |
| 7,206,857 B1* | 4/2007 | Mammen et al. | 709/238 |
| 7,246,191 B2 | 7/2007 | Stanton | |
| 7,253,387 B2 | 8/2007 | Archer et al. | |
| 7,346,067 B2 | 3/2008 | Chung et al. | |
| RE40,423 E | 7/2008 | Nance et al. | |
| 7,536,669 B1 | 5/2009 | Anderson | |
| 7,616,518 B2 | 11/2009 | Im et al. | |
| 7,660,167 B1* | 2/2010 | Roge et al. | 365/189.05 |
| 7,675,931 B1* | 3/2010 | Pritchard | H04L 12/66 |
| | | | 370/463 |
| 8,089,813 B2 | 1/2012 | Dreps | |
| 8,296,581 B2 | 10/2012 | Jennings et al. | |
| 8,595,398 B2* | 11/2013 | Maheshwari | G11C 7/1075 |
| | | | 365/230.05 |
| 8,688,877 B1* | 4/2014 | Lee et al. | 710/71 |
| 2002/0093507 A1* | 7/2002 | Olarig | 345/568 |
| 2003/0167374 A1* | 9/2003 | Hronik | G06F 13/4243 |
| | | | 711/104 |
| 2003/0174569 A1* | 9/2003 | Amidi | 365/230.03 |
| 2004/0071250 A1* | 4/2004 | Bunton et al. | 375/372 |
| 2005/0018514 A1* | 1/2005 | Knaack et al. | 365/221 |
| 2005/0024369 A1* | 2/2005 | Xie | 345/547 |
| 2005/0033875 A1* | 2/2005 | Cheung et al. | 710/29 |
| 2005/0057996 A1* | 3/2005 | Yamauchi et al. | 365/222 |
| 2005/0060470 A1* | 3/2005 | Main et al. | 710/305 |
| 2005/0141279 A1* | 6/2005 | Shin | 365/185.22 |
| 2005/0177660 A1* | 8/2005 | Mamidwar et al. | 710/52 |
| 2008/0195894 A1* | 8/2008 | Schreck | G06F 11/1056 |
| | | | 714/34 |
| 2008/0209089 A1 | 8/2008 | Mo et al. | |
| 2009/0010044 A1* | 1/2009 | Sakimura | G11C 11/16 |
| | | | 365/158 |
| 2009/0083500 A1* | 3/2009 | Burchard et al. | 711/154 |
| 2009/0100206 A1* | 4/2009 | Wang | 710/112 |
| 2009/0100285 A1* | 4/2009 | Bae et al. | 713/400 |
| 2009/0290436 A1 | 11/2009 | Hur et al. | |
| 2010/0198936 A1* | 8/2010 | Burchard et al. | 709/212 |
| 2010/0228908 A1* | 9/2010 | Maheshwari | 711/103 |
| 2010/0228926 A1* | 9/2010 | Maheshwari | 711/149 |

OTHER PUBLICATIONS

Arrow Electronics, Arrow Innovation, Oct. 2003, Arrow NE Marcom Department/Resource Design Communications Ltd.

Cypress Semiconductor Corporation, Data Sheet CY7C1303BV25/CYC1306BV25. 18 Mbit Burst of Two Pipelined SRAM with QDR(R) Architecture, Aug. 25, 2009.

U.S. Appl. No. 12/720,517: "Multi-Port Memory Devices and Methods" Dinesh Maheshwari et al., filed Mar. 9, 2010; 51 pages.

USPTO Non Final Rejection for U.S. Appl. No. 12/720,517 dated Mar. 27, 2013; 7 pages.

USPTO Non-Final Rejection for U.S. Appl. No. 12/757,614 dated May 12, 2014; 20 pages.

USPTO Notice of Allowance for U.S. Appl. No. 12/720,517 dated Jul. 31, 2013; 6 pages.

USPTO Notice of Allowance for U.S. Appl. No. 12/720,517 dated Sep. 17, 2013; 6 pages.

"PMC-FPGA02 Xilinx Virtex-II FPGA PMC", Transtech DSP, 2002.

TEK Microsystems, Inc., "Quixilica VENUS VXS-1", 2005; 4 pages.

Xilinx, "Synthsesizable QDR SRAM Interface", Application Note: Virtex-II Series; dated Aug. 29, 2003; 22 pages.

* cited by examiner

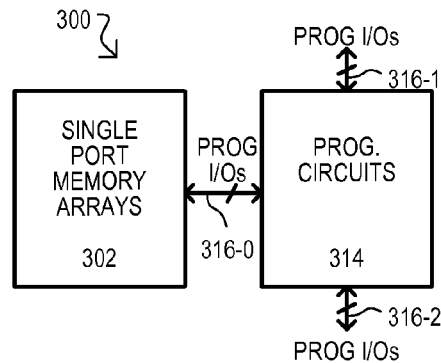
FIG. 3A
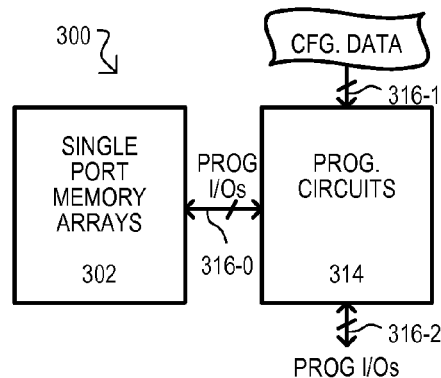
FIG. 3B
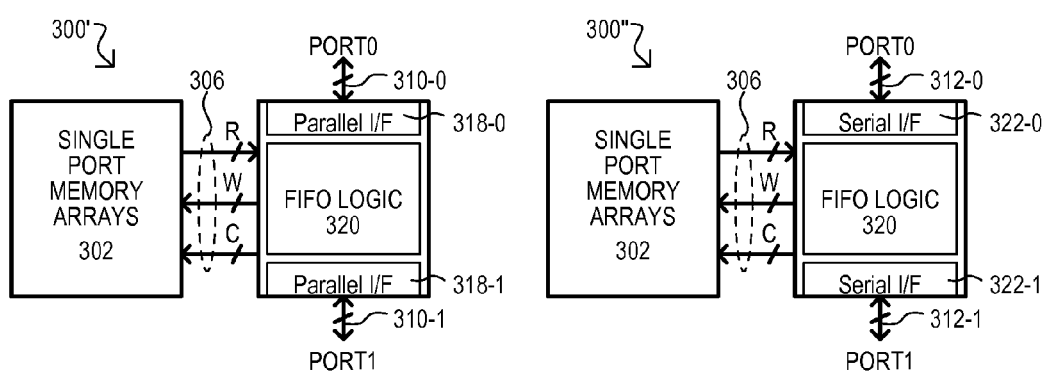
FIG. 3C-0
FIG. 3C-1

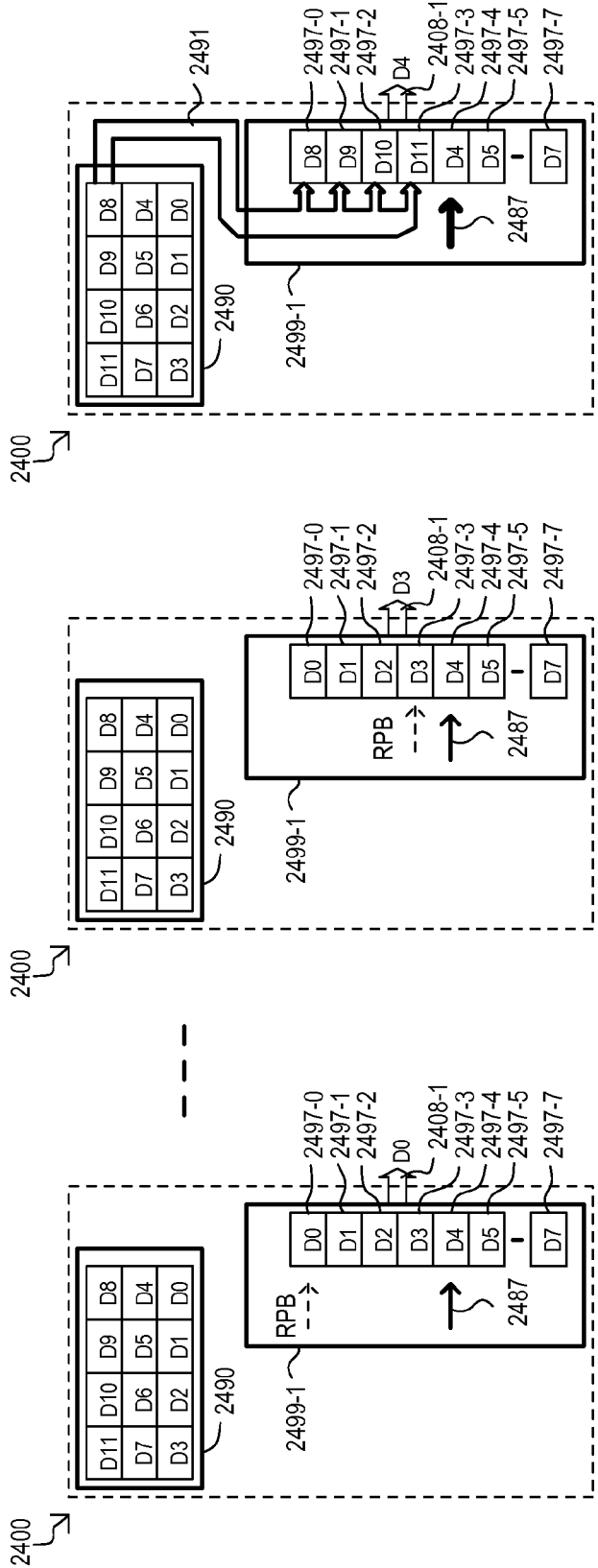

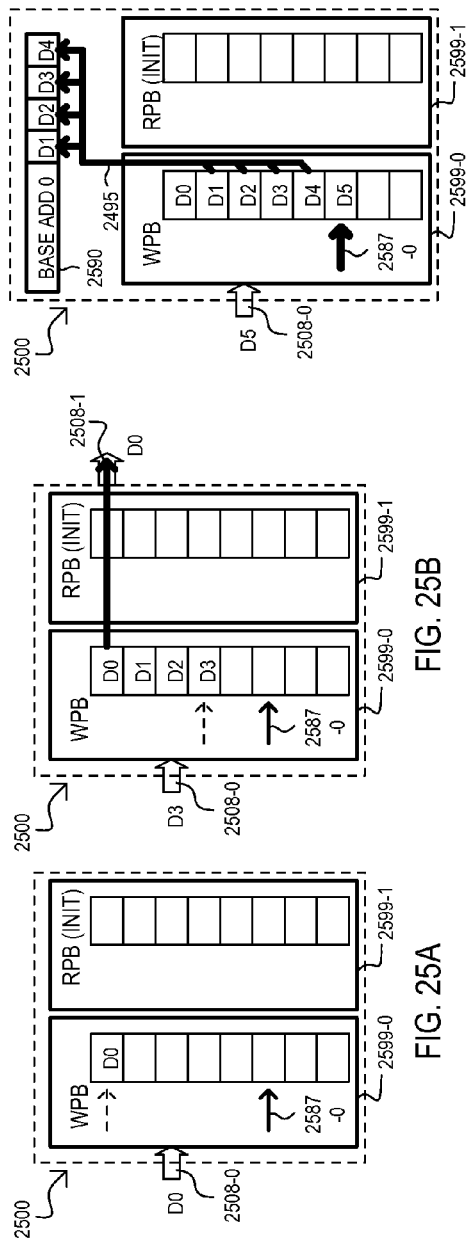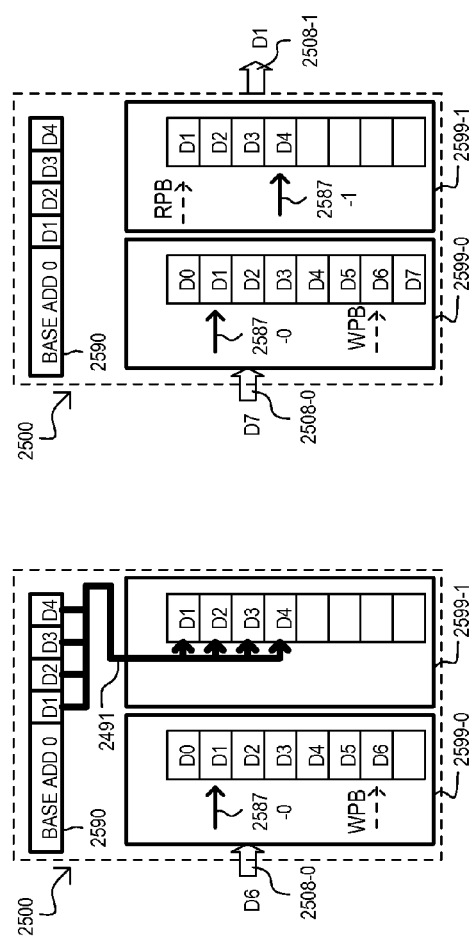

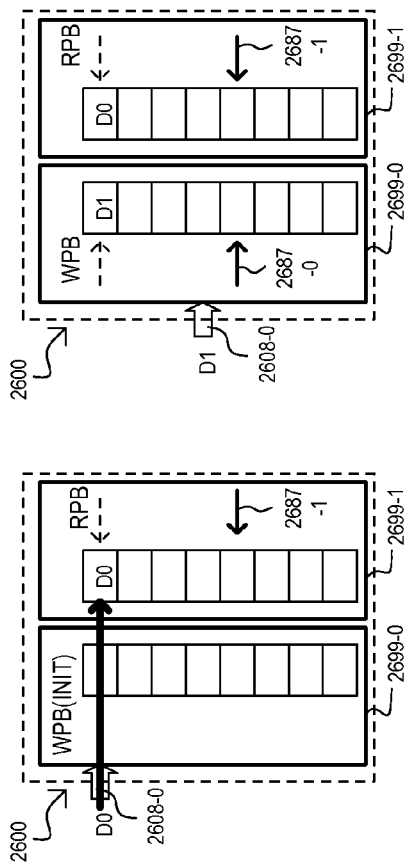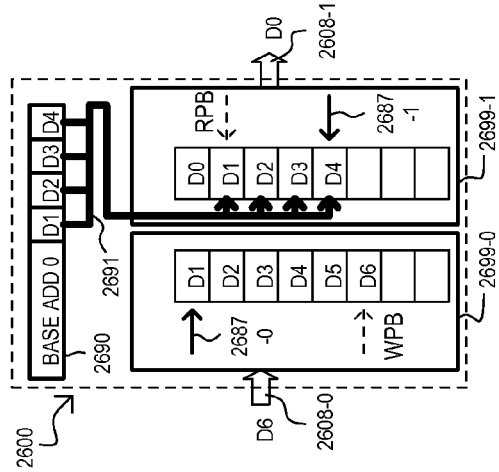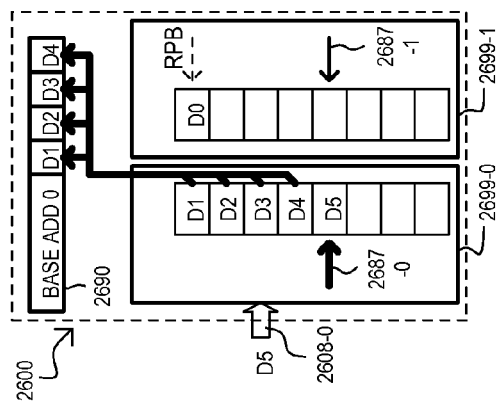

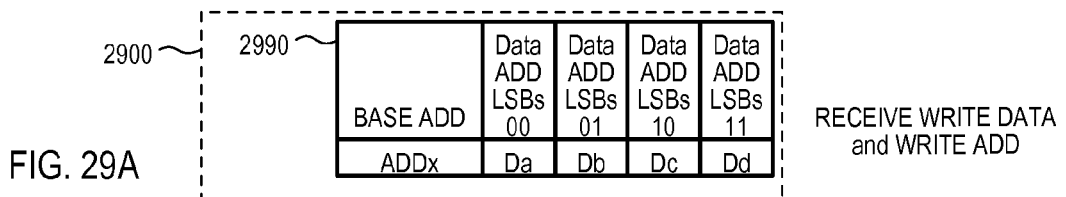
FIG. 29A   RECEIVE WRITE DATA and WRITE ADD
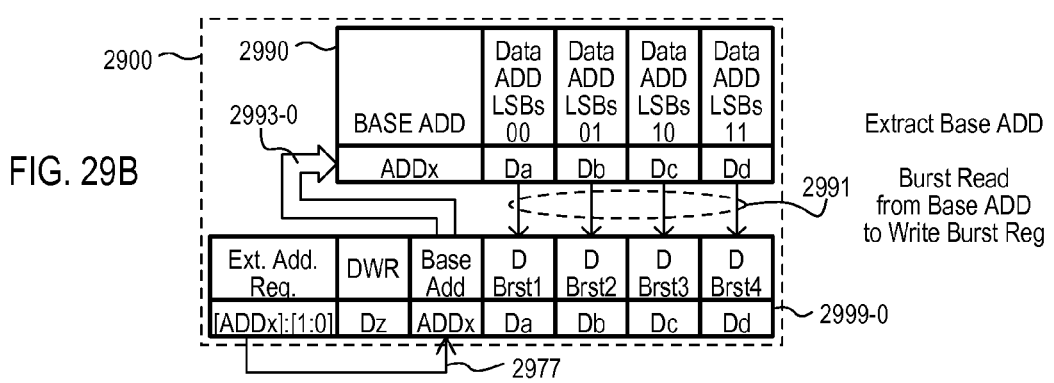
FIG. 29B   Extract Base ADD
Burst Read from Base ADD to Write Burst Reg
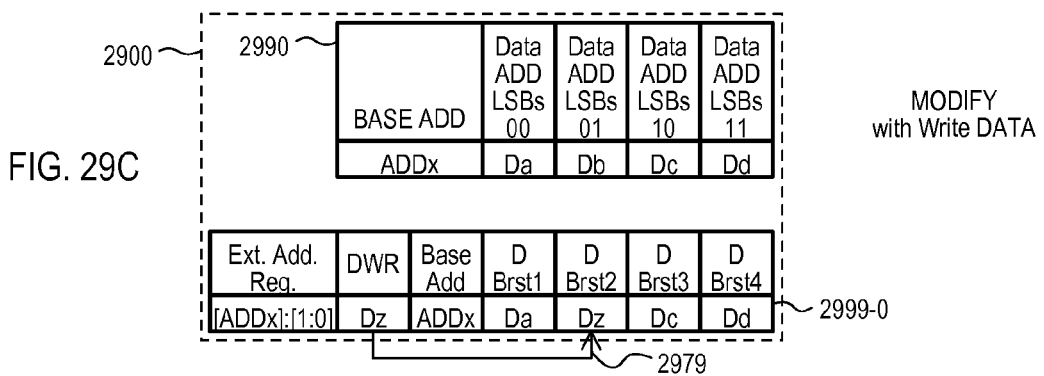
FIG. 29C   MODIFY with Write DATA
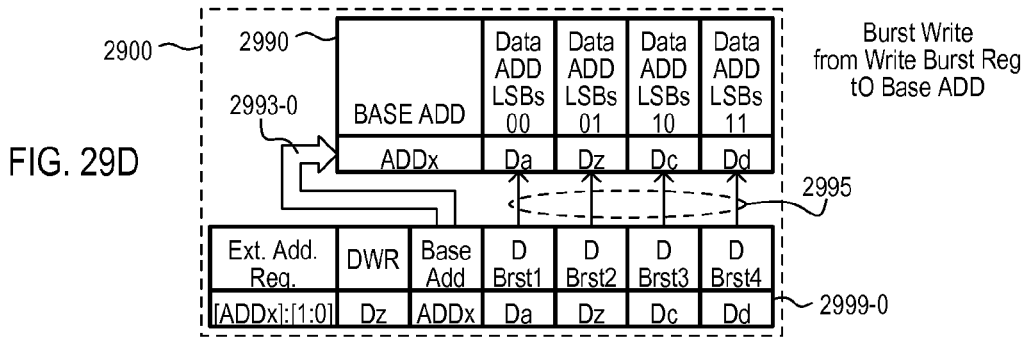
FIG. 29D   Burst Write from Write Burst Reg to Base ADD

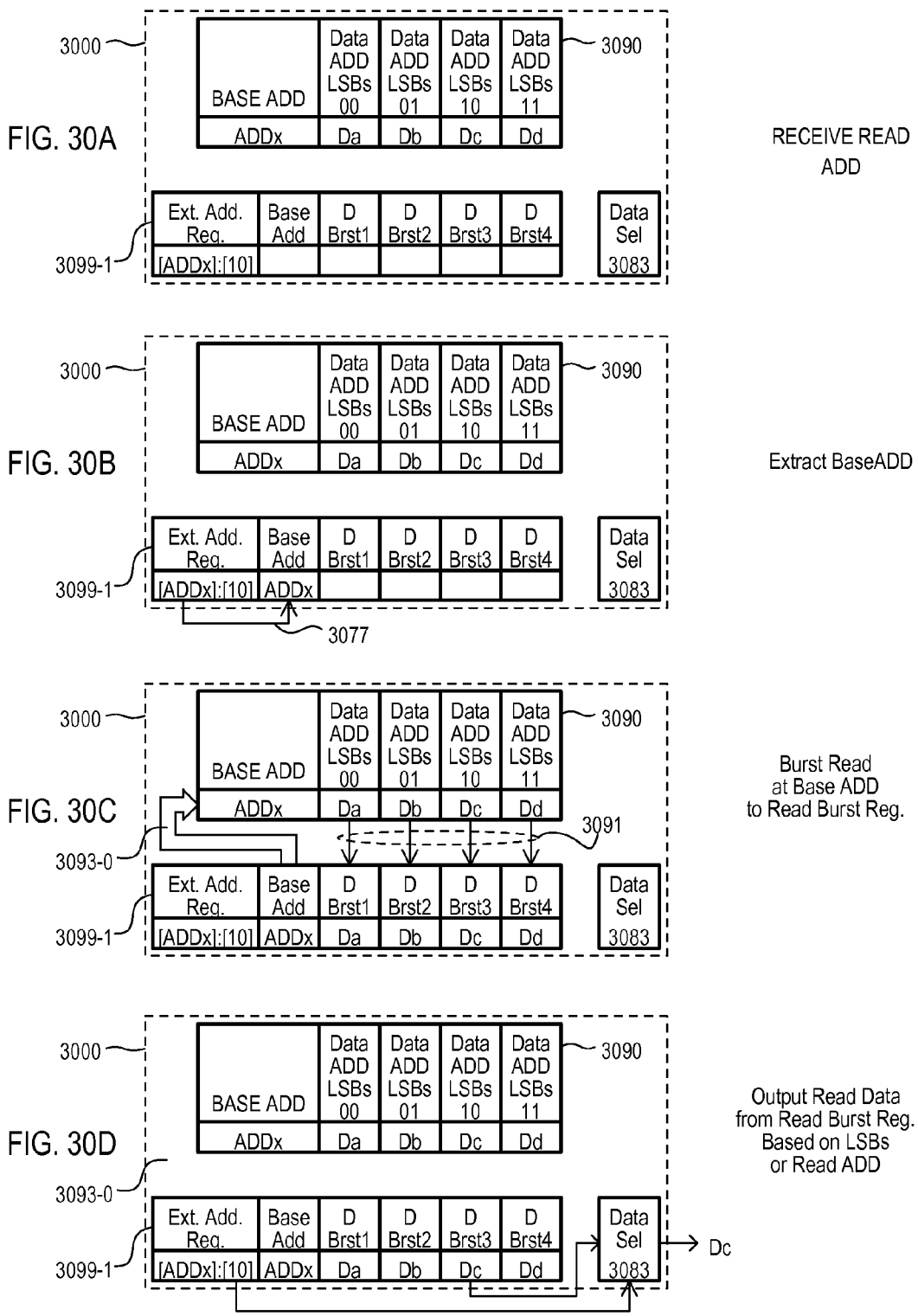

MULTI-PORT INTEGRATED CIRCUIT DEVICES AND METHODS

This application claims the benefit of U.S. provisional patent application Ser. No. 61/167,971 filed on Apr. 9, 2009, the contents of which are incorporated by reference herein. This application is also a continuation-in-part of U.S. patent application Ser. No. 12/720,517 filed on Mar. 9, 2010 which claims the benefit of U.S. provisional patent application Ser. No. 61/158,676 filed on Mar. 9, 2009.

TECHNICAL FIELD

The present disclosure relates generally to integrated circuit devices, and more particularly to memory devices having multiple ports to access storage locations.

BRIEF DESCRIPTION OF THE DRAWINGS

FIGS. 3A to 3C-1 are a sequence of block schematic diagrams showing memory devices and methods according to further embodiments.

FIGS. 24A to 23C are a sequence of block diagrams showing FIFO device read operations according to an embodiment.

FIGS. 25A to 25E are a sequence of block diagrams showing FIFO device "fall through" operation according to an embodiment.

FIGS. 26A to 26D are a sequence of block diagrams showing FIFO device "fall through" operations according to another embodiment.

FIGS. 29A to 29D are a sequence of block diagrams showing multi-port memory device write operations according to an embodiment.

FIGS. 30A to 30D are a sequence of block diagrams showing multi-port memory device read operations according to an embodiment.

DETAILED DESCRIPTION

Figure 1:
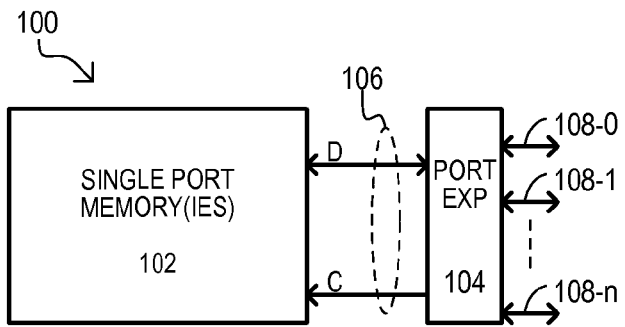
FIG. 1 is a block schematic diagram of a memory device according to a first embodiment.

Various embodiments will now be described that show multi-port memory devices and methods that include a single port memory integrated circuit portion connected to two or more memory ports by another integrated circuit portion. In the various embodiments shown herein, like sections may be referred to by the same reference characters, but with the leading digit(s) corresponding to the figure number.

Referring now to FIG. 1, an integrated circuit device according to a first embodiment is shown in a block schematic diagram and designated by the general reference character 100. A device 100 may include a single port memory (SPM) portion 102 and a port expansion portion 104 connected to one another over a single port connection 106.

An SPM portion 102 may include one or more SPM memory arrays accessed by one memory port. A memory port may include those signals necessary to access memory device for read and/or write operations. In one embodiment, a memory port may generally include control inputs (C) for determining a type, timing and location of an access operation (e.g., read or write, program or erase) and one or more data paths (D) for enabling data to be read from and/or written to the memory array(s). In a very particular embodiment, a control inputs may include command data signals, address signals, and timing (e.g., clock) signals.

An SPM memory portion 102 may differ from "true" dual port arrays in that arrays may not be accessed simultaneously by way of two different ports, but rather may be accessed sequentially by a single port. Consequently, an SPM memory portion 102 may be less complex than, occupy less area than, and be less costly to manufacture than a true dual-port memory circuit.

In some embodiments, an SPM memory portion 102 may include memory arrays based all or in part on any of various memory technologies, including but not limited to: dynamic random access memories (DRAMs), static RAMs (SRAMs), "pseudo" SRAMs (e.g., memories with DRAM based cores and SRAM type interfaces), or electrically erasable and programmable read-only-memories (EEPROMs), such and NAND type flash memories and/or NOR type memories.

Single port connection 106 may be a parallel port connection, or alternatively, a serial port connection.

A port expansion portion 104 may include two or more memory ports 108-0 to -n. Each memory port (108-0 to -n) may serve as a data access "pipe" for another device to access storage locations within SPM portion 102 of memory device. As such, each port (108-0 to -n) may receive signals for accessing memory locations within SPM portion 102 by way of single port connection 106, and may also output data from SPM portion 102 to any of ports (108-0 to -n). A port expansion portion 104 may include multi-port access logic that may transform or forward requests at any of various ports (108-0 to -n) into ordered accesses to SPM portion 102.

In particular embodiments, such multi-port access may be random access logic that allows requests from various ports to be serviced in a random order.

In other embodiments, a port expansion portion 104 may include first-in-first-out (FIFO) logic that may process accesses from multiple ports in first-in-first-out fashion (with respect to port inputs). In such embodiments, requests from multiple ports may be ordered within a port expansion portion and applied in a sequential order to SPM portion 102. In a similar fashion, data may be output from SPM portion 102 in a sequential fashion and then forwarded to an appropriate port (108-0 to -n).

As will be described in more detail below, in some embodiments, all or a portion of a port expansion portion 104 may be formed with programmable circuits that are programmed with configuration values to provide communication paths between ports (108-0 to -n) and a single port of SPM portion 102. Further, in some embodiments, all or a portion of a port expansion portion 104 may be formed in a same substrate as SPM portion 102. Alternatively, SPM portion 102 and port expansion portion 104 may be separate integrated circuit devices connected to one another in a single integrated circuit package.

In this way, an integrated circuit device may include a first IC portion having an SPM and a second IC portion that enables any of multiple ports to access the SPM.

Figure 2A:
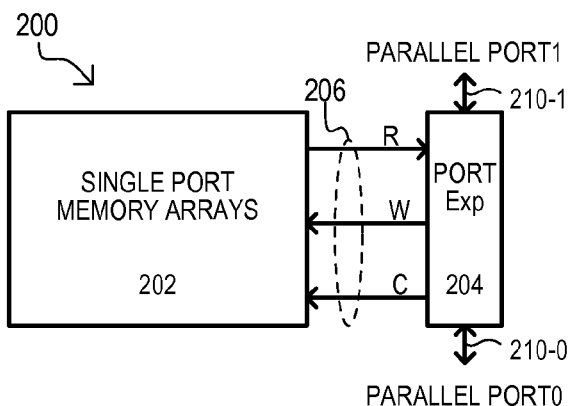
FIGS. 2A and 2B are block schematic diagrams of memory devices according to other embodiments.
Figure 2B:
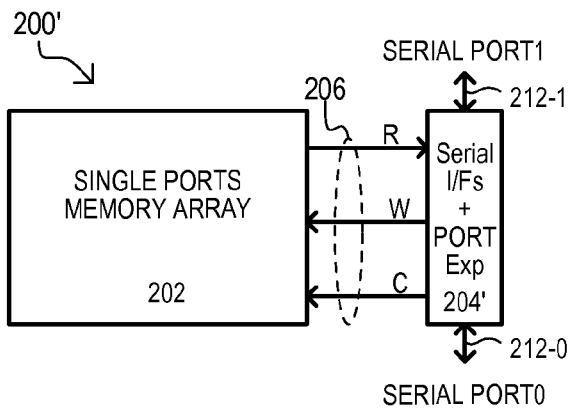

Referring to FIGS. 2A and 2B, very particular embodiments of a dual-port memory device (DPM) are shown in block schematic diagrams. The embodiments of FIGS. 2A and 2B may be very particular implementations of that shown in FIG. 1.

Referring to FIG. 2A, a DPM device is shown in a block schematic diagram and designated by the general reference character 200. A DPM 200 may include a single port connection 206 having a data path (D) divided into a read data path (R) that may output data from an SPM portion 202, as well as a write data path (W) that may receive data from a port expansion portion 204.

In addition, a port expansion portion 204 may include a first parallel port (PORT0) 210-0 and a second parallel port (PORT1) 210-1 that may be connected to single port connection 206 by FIFO logic. Parallel ports (210-0/1) may provide control and data paths where multi-bit data values are transmitted in parallel. For example, in a read operation multi-bit address and command data may be received in parallel (in one or more sets), on input on signal lines. Subsequently, read data may be output in parallel on signal lines. In a write operation, multi-bit address, command data, and write data may be received in parallel (in one or more sets) on input on signal lines. In particular embodiments, address and data values may be multiplexed, with address values being applied at a different time than corresponding data values.

It is understood that parallel ports (PORT0 and PORT1) may be different types of parallel ports. Different parallel ports may include, without limitation, DRAM type interfaces (e.g., DDR, DDR2, DDR3), SRAM interfaces, or flash memory interfaces. Referring to FIG. 2B, another DPM device is shown in a block schematic diagram and designated by the general reference character 200'. A DPM device 200' may include sections like those of FIG. 2A, however, unlike FIG. 2A, a port expansion portion 204' may include a first serial port (PORT0) 212-0 and a second serial port (PORT1) 212-1 which may be connected to single port connection 206 by FIFO logic. Serial ports (212-0/1) may provide control and data paths where multi-bit data values are transmitted in a serial manner. For example, in a read operation either of a multi-bit address and command data value may be received in a serial fashion on one or more signal lines. Subsequently, read data may be output in serial fashion on one or more signal lines. In a like fashion, in a write operation, multi-bit address, command data, and write data may be received in a serial fashion on one or more input signal lines.

As in the case of FIG. 2A, in FIG. 2B serial ports (PORT0 and PORT1) may be different types of serial ports. Different serial ports may include, without limitation, PCI Express, RapidIO, USB, Serial ATA (SATA) or IEEE 1394 interface (Firewire).

Parallel ports (210-0/1) and/or serial ports (212-0/1) may have input write data lines separate from output read data lines, or may include data input/output (I/O) lines for both read and write data.

While FIG. 2A shows only parallel ports and FIG. 2B shows only serial ports, other embodiments may include one or more parallel ports in conjunction with one or more serial ports.

In this way, a SPM memory may be accessed by any of multiple parallel ports and/or serial ports.

Referring now to FIGS. 3A to 3C-1, programmable multi-port memory devices and methods according to other embodiments are shown in a series of block schematic diagrams.

Referring to FIG. 3A, a memory device is shown in a block schematic diagram and designated by the general reference character 300. A device 300 may include an SPM portion 302 and a programmable circuit portion 314. An SPM portion 302 may have features of SPM portions described in other embodiments herein, and equivalents.

A programmable circuit portion 314 may include programmable circuits that may be configured into various functions based on configuration data. In some embodiments, a programmable circuit portion 314 may include circuits that are capable of being reconfigured many times. Such circuits may include volatile storage circuits that are loaded with configuration data (from a nonvolatile memory) for example, to thereby be programmed to a particular configuration. Alternatively, programmable circuit portion 314 may include one-time programmable elements (e.g., anti-fuse) for establishing a desired function. Still further, as a will be shown in other embodiments below, programmable circuit portion 314 may include one or more non-programmable circuit blocks with set functions in addition to programmable circuits. In some embodiments, all or a portion of a programmable circuit portion 314 may be formed in a same substrate as SPM portion 302. Alternatively, SPM portion 302 and programmable circuit portion 314 may be separate integrated circuit devices connected to one another in a single integrated circuit package.

Referring still to FIG. 3A, in the embodiment shown, a programmable circuit portion 314 may include a number of programmable input/output (I/O) lines 316-0 to 316-2. Programmable I/O lines 316-0 may be connected to SPM portion 302 (and after a programming step may form a single port connection 306).

Referring now to FIG. 3B, a programmable circuit portion 314 may receive configuration data (CFG. DATA). Such configuration data may establish a function of programmable circuits within portion 314.

FIG. 3C-0 shows a first programmed embodiment of device 300 after a programmable circuit portion 314 has been configured in response to one set of configuration data. As shown in the figure, programmable circuit portion 314 may be configured to include a first parallel interface (I/F) 318-0, a second parallel interface (I/F) 318-1, and FIFO logic 320. With parallel interfaces 318-0/1 created, programmable I/Os 316-1 form part of a first parallel port PORT0 while programmable I/Os 316-2 form part of a second parallel port. In addition, FIFO logic 320 may result in programmable I/Os 316-1 forming a single port connection 306. The programmed device of FIG. 3C-0 may be one version of that shown in FIGS. 1 and/or 2A.

FIG. 3C-1 shows a second programmed embodiment of device 300 after a programmable circuit portion 314 has been configured in an alternative way in response to another set of configuration data. As shown in the figure, programmable circuit portion 314 may be configured to include a first serial I/F 322-0, a second serial I/F 322-1, and FIFO logic 320. Consequently, programmable I/Os 316-0, -1, and -2 may form parts of a single port connection 306, first serial port PORT0 312-0, and second serial port 312-1, respectively. The programmed device of FIG. 3C-1 may be one version of that shown in FIGS. 1 and/or 2B.

While the embodiments of FIGS. 3C-0 and 3C-1 show programmable circuit portion 314 configured to include two ports to access SPM portion 302, other embodiments may include more ports for accessing a same single port section. Further, while FIGS. 3C-0 and 3C-1 show FIFO logic 320 other embodiments may have different kind of logic for forwarding requests to SPM portion 302.

In this way, a multi-port memory device may include programmable circuits that may be programmed to form two or more ports for accessing a single port device. Such programmability may enable one device to be deployed that can accommodate multiple different port specifications by allowing the device to be programmed to meet such specifications. Thus, a programmable circuit portion to provide a flexible interface to accommodate various applications.

While the embodiments of FIGS. 3A to 3C-1 show a programmable circuit portion in which various sections of a port expansion section are created with programmable circuits, in other embodiments, a programmable circuit portion may include circuit blocks with predetermined functions that are substantially not programmable. Such embodiments will be described with reference to FIGS. 4A to 5B.

Figure 4A:
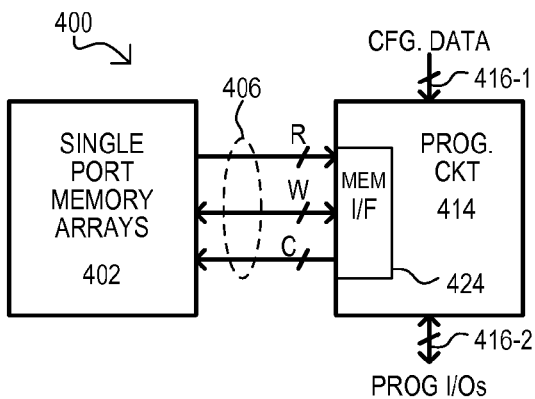
FIGS. 4A and 4B are block schematic diagrams showing a memory device and method according to yet other embodiments.

Referring to FIG. 4A, a memory device is shown in a block schematic diagram and designated by the general reference character 400. A device 400 may include an SPM portion 402 and a programmable circuit portion 414, like the embodiment shown in FIG. 3A. However, unlike FIG. 3A, programmable circuit portion 414 may include a prefabricated section 424, which in this case is a memory I/F that may communicate with SPM portion 402 along single port connection 406. That is, programmable portion 414 is manufactured with a memory interface 424, thus such all or a portion of such a feature does not necessarily have to be created with programmable circuits.

Figure 4B:
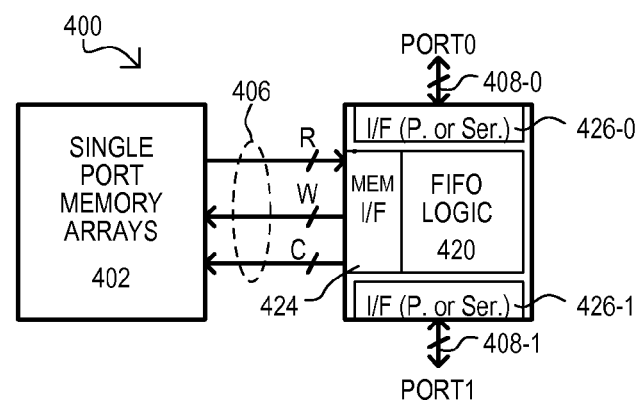

FIG. 4B shows device 400 after a programmable circuit portion 414 has been configured in response to configuration data. As shown in the figure, programmable circuit portion 414 has been configured to include a first I/F 426-0, a second I/F 426-1, and FIFO logic 420. Interfaces 426-0/1 may be parallel or serial interfaces that form memory ports 408-0/1. The programmed device of FIG. 4B may be one version of that shown in any of FIGS. 1 to 2B.

Figure 5A:
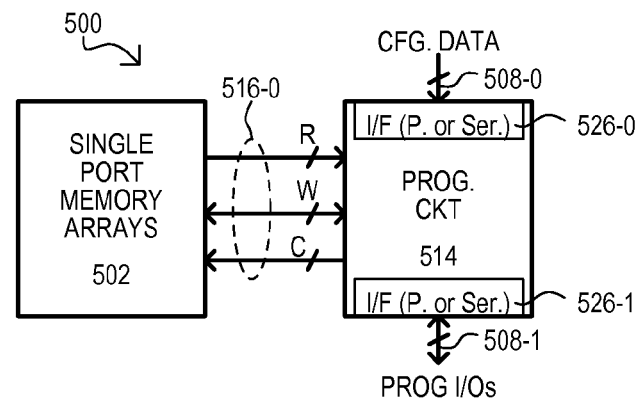
FIGS. 5A and 5B are block schematic diagrams showing a memory device and method according to other embodiments.

Referring to FIG. 5A, a memory device is shown in a block schematic diagram and designated by the general reference character 500. A device 500 may include an SPM portion 502 and a programmable circuit portion 514. Programmable circuit portion 514 may also include prefabricated sections 526-0 and -1, which in this case may be interfaces (I/F) that provide ports (508-0/1) for accessing SPM portion 502. Interfaces (I/F) may be parallel or serial interfaces.

Figure 5B:
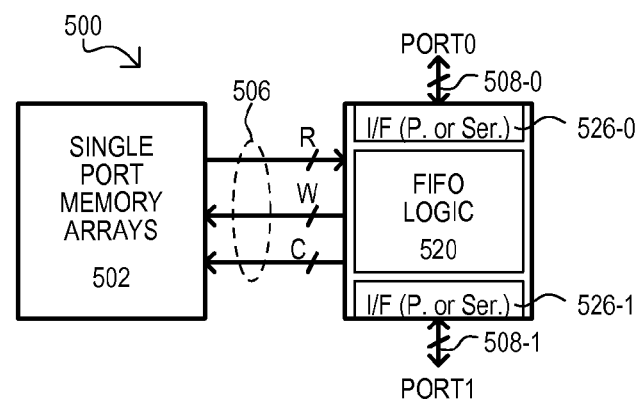

FIG. 5B shows device 500 after a programmable circuit portion 514 has been configured in response to configuration data. As shown in the figure, programmable circuit portion 514 has been programmed to include FIFO logic 520 that may allow access to SPM portion 502 by way of ports 508-0/1.

In this way, a multi-port memory device may include programmable circuits that may be programmed to form two or more ports for accessing a single port device, where such programmable circuits may include sections with prefabricated circuits that are not substantially programmable. The programmed device of FIG. 5B may be one version of any of those shown in FIGS. 1 to 2B.

A memory device according to embodiments may include an SPM portion and a port expansion portion, which may be programmable, partially programmable or substantially not programmable. In some embodiments, such different portions may be formed in a same integrated circuit substrate, as shown in FIGS. 6A to 6D.

Figure 6A:
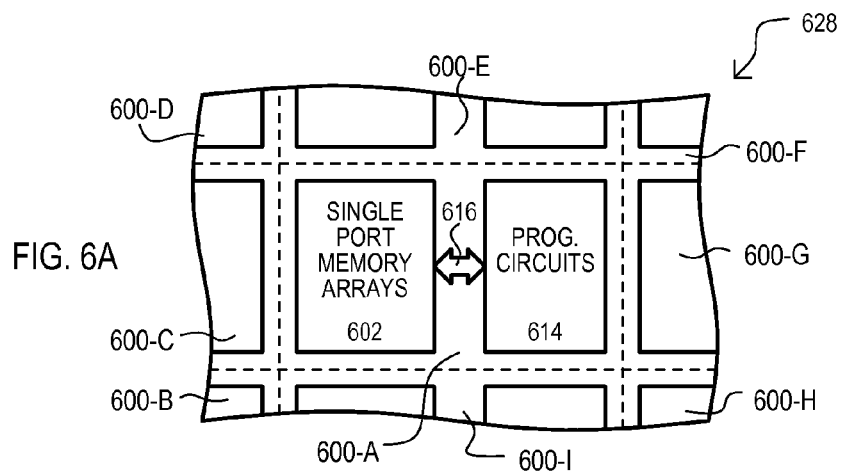
FIGS. 6A to 6D are a series of top plan views showing memory devices and methods according to embodiments.

Referring to FIG. 6A, memory devices 600-A to -I may be formed in a manufacturing substrate 628 (memory devices 600-B to -I only shown in part). Each memory device (600-A to -I) may include an SPM portion 602 and a programmable circuit portion 614 such as those described in the embodiments herein, or equivalents. Accordingly, an SPM portion 602 may be conceptualized as being embedded with a programmable circuit 614, or vice versa.

In one embodiment, a substrate 628 may be a semiconductor substrate. In a particular embodiment, a substrate may be a semiconductor wafer and portions 602 and 614 may be fabricated with integrated circuit manufacturing techniques.

Figure 6B:
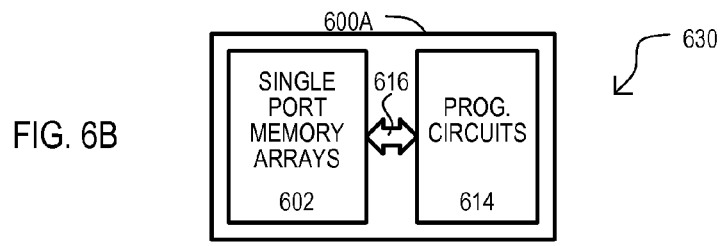

Referring to FIG. 6B, a manufacturing substrate 628 may be divided into individual device substrates (one shown as 630). In one embodiment, a wafer may be cut into individual dice (e.g., 630). Thus, each die has integrated on it both an SPM portion 602 and a programmable circuit portion 614.

Figure 6C:
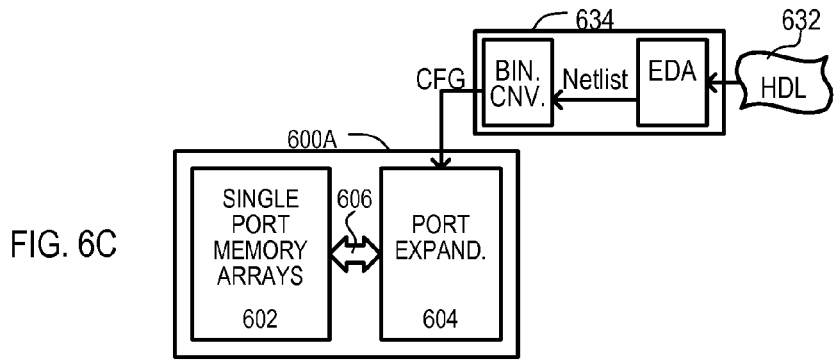

Referring to FIG. 6C, design data (HDL) 632 may be created for a particular port configuration that is compatible with programmable circuit portion 614. Such design data 632 may be converted to configuration data (CFG) suitable for programmable circuit portion 614 by a data converter 634. As a result, programmable circuit portion 614 may be programmed to provide multiple ports for accessing SPM portion 602. In very particular embodiments, a programmable circuit portion 614 may be programmed as shown in 3A to 3B.

While devices may be fabricated with a programmable portion that is configured with design data to provide multiple ports to a single port memory architecture, the same design data may be utilized to fabricate a substantially non-programmable port expansion portion. Such an embodiment is shown in FIG. 6D.

Figure 6D:
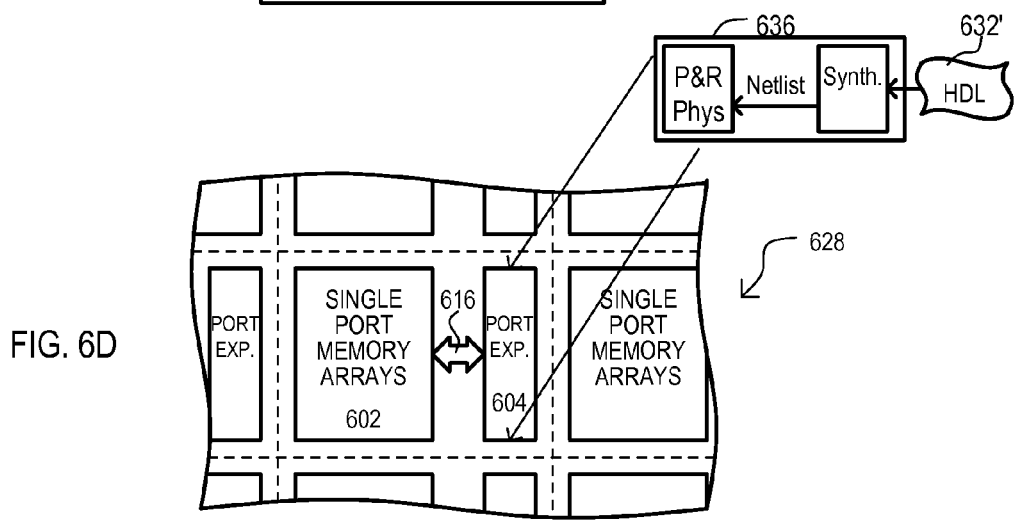

Referring to FIG. 6D, design data (HDL) 632' may be created for a particular port configuration that is compatible with programmable circuit portion 614. Such design data 632' may be converted into a physical design by a design tool 636. Physical design data may include the physical circuit layout (e.g., mask layers) for creating a port expansion portion. Such a physical design may create a port expansion portion 604 with SPM portion 602 to create a substantially non-programmable multi-port device. In particular embodiments, a port expansion portion 604 may be a logic "sliver" (e.g., relatively small portion of a semiconductor substrate) that may be added to an existing SPM portion 602 design.

Referring to FIGS. 6C and 6D, in some embodiments, design data 632' may be the same as that shown as 632 in FIG. 6C. For example, while an initial manufacturing of a memory product may occur as shown in FIG. 6C, if demand reaches a predetermined level, a device having the same functionality may be created as shown in FIG. 6D. In such an embodiment, a port expansion portion formed with the physical design may be substantially smaller than a programmable circuit portion 614.

In very particular embodiments, a device like that of FIG. 6C may be one version of any of those shown in FIGS. 1 to 5B. Further, a device like that of FIG. 6D may be one version of that shown in any of FIG. 1, 2A or 2B.

In this way, a memory device may have a single port memory portion and a port expansion portion formed in a same substrate.

While the embodiments of FIGS. 6A to 6D show a memory device in which an SPM portion and a port expansion portion may be formed in a same integrated circuit (IC) substrate, other embodiments may include such portions being formed in different IC substrates. One such embodiment is shown in FIGS. 7A to 7D.

Figure 7A:
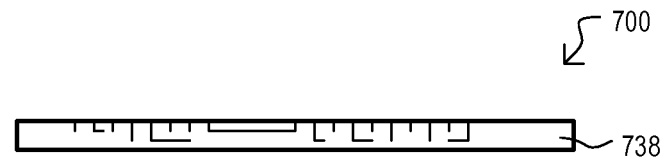
FIGS. 7A to 7D are a sequence of side cross sectional views showing a memory device and method according to yet another embodiment.

Referring to FIG. 7A, a memory device 700 may include a multi-die IC package structure 738. A package structure 738 may provide conductive connections between multiple IC devices (e.g., dice) as well as other circuit elements such as passive circuit elements. In addition, a package structure 738 may also provide input and output connections for communicating with other devices of a larger system. In the embodiment shown, a package structure 738 may be multi-chip circuit board structure that allows connections to IC dice on one side, and package connections on another. However, other embodiments may include other device orientations, such as vertical dice stacking, including dice connected by vertical through vias and/or aligned pad locations.

Figure 7B:
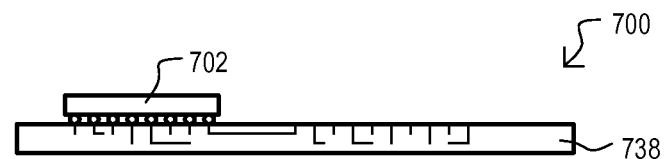

Referring to FIG. 7B, a first IC substrate may be connected to package structure 738. In the embodiment shown, such a first IC substrate may be an SPM portion 702. An SPM portion 702 may have a structure like that described in other embodiments, and equivalents.

Figure 7C:
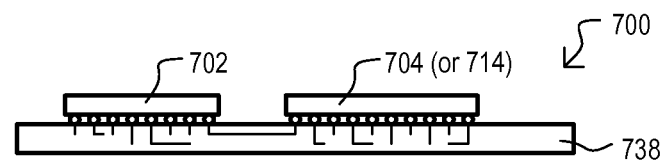

Referring to FIG. 7C, a second IC substrate may be connected to package structure 738. In the embodiment shown, such a second IC substrate may be a port expansion portion 704. In some embodiments, such a port expansion portion may be a programmable circuit portion 714 that is programmed to provide multi-port access to SPM portion 702, or may be programmed (or reprogrammed) at a later point to provide such function.

Figure 7D:
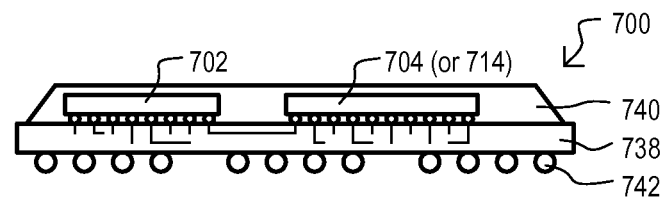

Referring to FIG. 7D, a protection structure 740 may be formed over SPM portion 702 and port expansion portion 704. Further external package connections (one shown as 742) may be finalized to form a memory device 700. A memory device 700 may thus form a "system-in-package" (SIP) that includes SPM portion and port expansion portion (or programmable circuits to form a port expansion portion).

In particular embodiments, a memory device 700 may be one implementation of those shown in any of FIGS. 1 to 5B.

In this way, a memory device may have a single port memory portion and a port expansion portion formed in different substrates and assembled into a same integrated circuit package.

Figure 8:
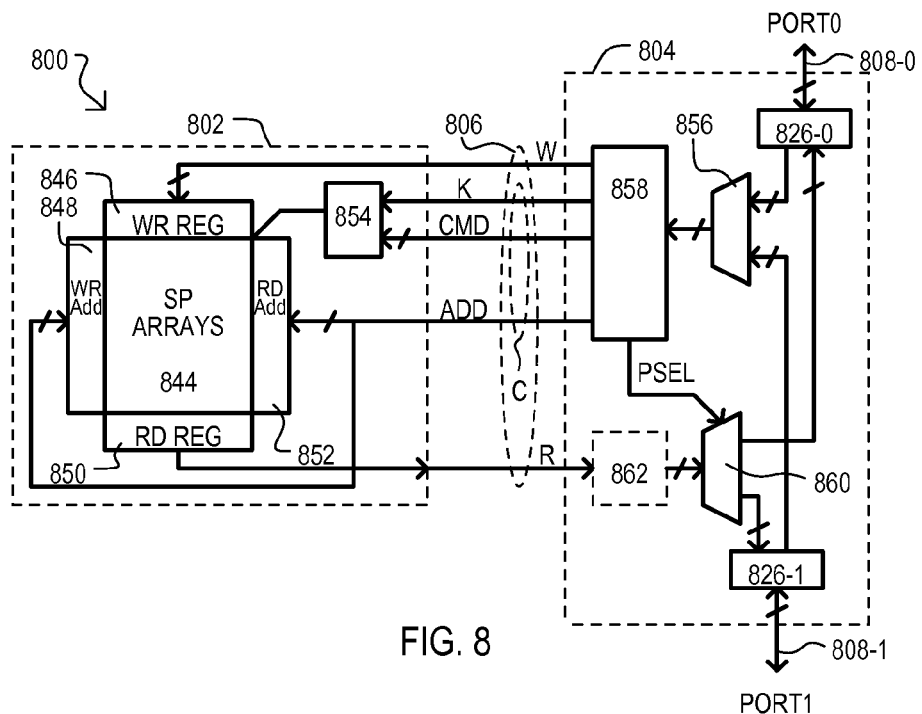
FIG. 8 is a block schematic diagram of a memory device according to an embodiment.

Referring to FIG. 8, a very particular embodiment of a memory device is shown in a block schematic diagram and designated by the general reference character 800. A memory device 800 may include a DPM portion 802 and a port expansion portion 804. A memory device 800 may include single port memory (SPM) arrays 844, a write data register 846, a write address decoder 848, a read data register 850, a read address decoder 852, and a timing and control circuit 854. SPM arrays 844 may include storage locations to store data received in write operations, and output stored data in read operations. SPM arrays 844 may be accessible for read and write operations in a sequential fashion. In particular embodiments, SPM arrays 844 may be volatile memory arrays, even more particularly, static random access memory (SRAM) arrays.

A write data register 846 may store write data received on a write data bus (W) that is to be stored within one of single port memory arrays 844. A write address decoder 848 may receive a write address on address lines (ADD), and decode such an address to determine where write data is to be stored within SPM arrays 844. Similarly, a read address decoder 852 may receive a read address on address lines (ADD), and decode such an address to determine from where read data is to be output. Read data register 850 may store read data output from SPM arrays 844, and provide such data on read data bus (R).

A timing and control circuit 854 may receive command data (CMD) indicating a type of operation (e.g., read or write) as well as timing signals (K) for controlling the timing of operations executed by SPM portion 802.

In one particular embodiment, an SPM portion 802 may have an architecture of a QDR™ Synchronous SRAM like those manufactured by Cypress Semiconductor Corporation having offices in San Jose, Calif., U.S.A. In a very particular embodiment, an SPM portion 802 may be a QDR™ Synchronous SRAM in die form.

In the embodiment of FIG. 8, a SPM portion 802 may be connected to a port expansion portion 804 by a single port connection 806 that includes a write data input (W), a read data output (R), and a control input (C) that may include timing signals (K), command data (CMD), and address values (ADD).

Referring still to FIG. 8, a port expansion portion 804 may include a first I/F circuit 826-0, a second I/F circuit 826-1, a FIFO input path 856, a port control circuit 858, an output multiplexer (MUX) circuit 860, and, optionally, an output translation circuit 862. First and second I/F circuits 826-0/1 may be parallel and/or serial interfaces according to embodiments described herein, and equivalents. Such I/F circuits 826-0/1 may provide separate ports 808-0/1 for accessing SPM portion 802.

FIFO input path 856 may be connected to first and second I/F circuits 826-0/1, and receive port access requests from such I/F circuits. Such access requests may include control data (e.g., address data, command data, and optionally timing signals) and input write data. A FIFO input path 856 may order such requests in a first-in-first-out fashion, to provide a sequence of requests to SPM portion 802 (through port control circuit 858). Accordingly, in particular embodiments, if two requests are received substantially simultaneously, FIFO input path 856 will order such requests in a sequential fashion according to predetermined criteria. Further, FIFO input path 856 may receive and/or determine port origination information for a port control circuit that indicates from which port (e.g., 808-0 or -1) a request (in particular a read request) originates.

A port control circuit 858 may receive sequences of requests from FIFO input path 856, and generate memory control signals suitable to SPM portion 802 to execute such requests. In addition, a port control circuit 858 may provide port select signals PSEL to FIFO output path 860 based on port origin information. Such an arrangement may ensure output data (e.g., read data) is output to the port originating the corresponding read request. In some embodiments, a port control circuit 858 may include command translation circuits in the event signals received at a port (e.g., 808-0/1) are not compatible with an architecture of SPM portion 802. In particular embodiments, a port control circuit 858 may be a circuit created with programmable circuits, thus a device 800 may accommodate various memory request formats.

Output MUX circuit 860 may have outputs connected to first and second I/F circuits 826-0/1 and receive output data from SPM portion 802. Based on port selection information (PSEL), output MUX circuit 860 may output data to a designated port (e.g., 808-0 or -1).

Optional output translation circuit 862 may receive data output from SPM portion 802 and translate it into a different format in the event devices at the ports 808-0/1 expect a different data format than that provided by SPM portion 802. As in the case of port control circuit 858, in particular embodiments, an output translation circuit 862 may be a circuit created with programmable circuits, thus a device 800 may accommodate various data format types.

In very particular embodiments, a memory device 800 may be one version of any of those shown in FIGS. 1 to 7D.

In this way, a memory device may include an SPM portion having separate read and write data buses, as well as separate read and write address decoders that receive address values from a same address bus.

Figure 9:
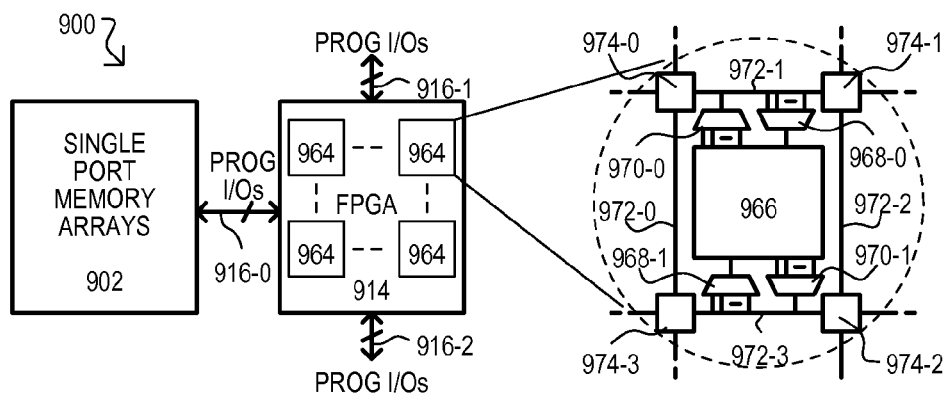
FIG. 9 is a block schematic diagram of a memory device according to a further embodiment.

Referring to FIG. 9, another very particular embodiment of a memory device is shown in a block schematic diagram and designated by the general reference character 900. A memory device 900 may include a SPM portion 902 and a programmable circuit portion 914. An SPM portion 902 may take the form of SPM portions shown in other embodiments herein, and equivalents.

A programmable circuit portion 914 may have programmable I/Os 916-0 that are connected or connectable to SPM portion 902, as well as programmable I/Os 916-1/2 that may serve as port I/Os in a programmed device. All or a portion of programmable circuit portion 914 may have a field programmable gate array (FPGA) type architecture, including a number of programmable sectors 964.

A programmable sector 964 for inclusion in the embodiments is shown in circle in FIG. 9. In the embodiment shown, programmable sector 964 may include a programmable core 966, programmable input MUXs 968-0/1, programmable output de-MUXs 970-0/1, data lanes 972-0 to -3, and programmable switch sections 974-0 to -3. A programmable core 966 may provide selectable logic functions according to configuration data, and may include programmable logic circuits, as but one example.

Data lanes 972-0 to -3 may include multiple signal lines, and collectively, may interconnect multiple programmable sectors 964 with one another. Programmable input MUXs 968-0/1 may selectively connect signals lines from data lanes 972-1/3 to inputs of programmable core 966 based on configuration data. Similarly, programmable output de-MUXs 970-0/1 may selectively connect outputs from programmable core 966 to signals lines of data lanes 972-1/3 based on configuration data. Switch sections 974-0 to -3 may selective connect signals of data lines to one another based on configuration information. An FPGA like architecture may enable the creation of re-configurable port expansion circuits having high data throughput rates, while allowing for flexibility in designs.

In very particular embodiments, a memory device 900 may be one version of any of those shown in FIGS. 1 to 6C and 7A to 8.

In this way, a memory device may include an SPM portion and a programmable circuit portion with an FPGA type architecture that may be programmed into a port expansion portion.

While some embodiments shown herein may include port expansion portions that allow two ports to access an SPM portion, other embodiments may include more than two ports. One particular embodiment having more than two ports is shown in FIG. 10.

Figure 10:
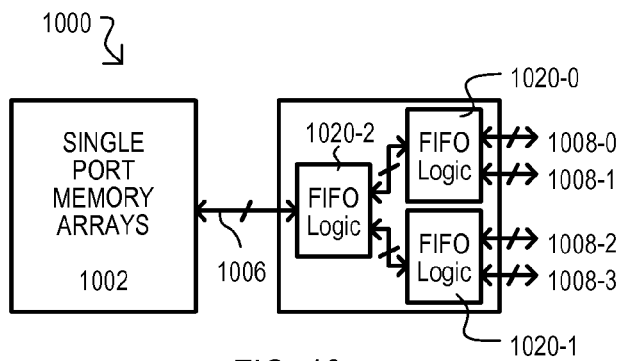
FIG. 10 is a block schematic diagram of a memory device according to yet another embodiment.

Referring to FIG. 10, an embodiment of a memory device is shown in a block schematic diagram and designated by the general reference character 1000. A memory device 1000 may include a SPM portion 1002 and a port expansion portion 1004. An SPM portion 902 may take the form of SPM portions shown in other embodiments herein, and equivalents.

A port expansion portion 1004 may include multiple FIFO logic sections to order requests from more than two ports. In the embodiment shown, port expansion portion 1004 may include three FIFO logic sections 1020-0 to -2 to enable requests to be sequentially ordered from four ports (PORT0 to PORT3) 1008-0 to -3 prior to being applied to SPM portion 1002. In more detail, a FIFO logic section 1020-0 may sequence requests from ports 1008-0/1 (PORT0 and PORT1). FIFO logic section 1020-1 may sequence requests from ports 1008-2/3 (PORT2 and PORT3). FIFO logic section 1020-2 may sequence requests output from the other FIFO logic sections 1020-0/1. Memory device of FIG. 10 may be one particular implementation of that shown in FIG. 1.

In this way, a memory device may include a port expansion portion with more than two ports that order requests form such ports with FIFO logic sections.

While embodiments of the invention may include circuits for enabling multi-port communication with an SPM portion, other embodiments may additionally include processing of data stored by an SPM portion. Two such embodiments will now be described with reference to FIGS. 11A and 11B.

Figure 11A:
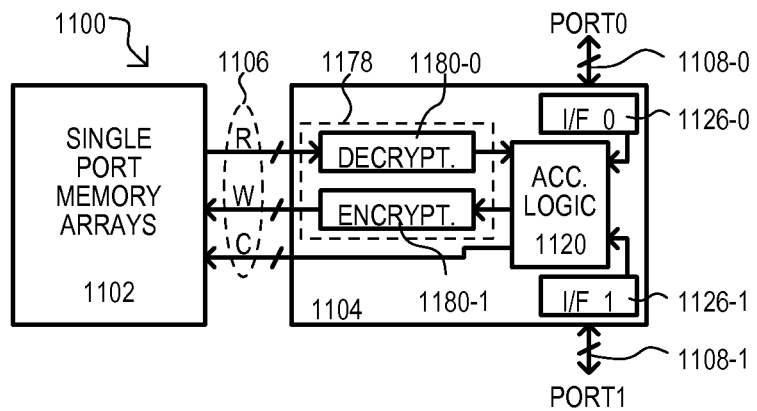
FIGS. 11A and 11B are block schematic diagrams of memory devices according to additional embodiments.
Figure 11B:
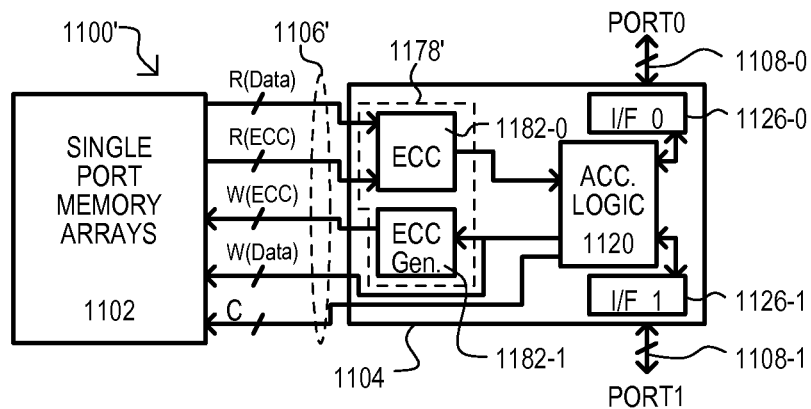

Referring now to FIGS. 11A and 11B, memory devices according to further embodiments are shown in block schematic diagrams and designated by the general reference characters 1100 and 1100', respectively. Memory device 1100 and 1100' may each include an SPM portion 1102 and a port expansion portion 1104. An SPM portion 1102 may take the form of SPM portions shown in other embodiments herein, and equivalents.

Port expansion portions 1104 and 1104' may include I/F circuits 1126-0/1 and access logic 1120. Such items may take the form of those shown in other embodiments, or equivalents. However, port expansion portions 1104 and 1104' may also include data processing sections 1178 and 1178'.

Referring to FIG. 11A, a data processing section 1178 of memory device 1100 may include an encryption circuit 1180-0 and a decryption circuit 1180-1. An encryption circuit 1180-0 may encrypt write data prior to such data being written into SPM portion 1102. A decryption circuit 1180-1 may decrypt read data prior to such data being output from SPM portion 1102.

In a particular embodiment, data processing section 1178 may be formed with programmable circuits, thus enabling different encryption/decryption schemes to be implemented according to application.

Referring to FIG. 11B, a data processing section 1178' of memory device 1100' may include error correction circuits. In particular, an error code generation circuit 1182-1 may generate error correction codes (ECC) from received write data, and allow such codes to be stored with corresponding write data within SPM portion 1102. In addition, a error check and correction circuit 1182-0 may receive read data values and corresponding ECC values from SPM portion, and check (and correct, if necessary) read data values prior to such data values being output from a port (e.g., 1108-0 or -1).

It is noted that the error correction configuration like that shown in FIG. 11B may also be implemented in the opposite data direction. That is, write data with corresponding ECC values may arrive from a port (e.g., 1108-0 or -1). An error check and correction circuit may receive such write data values and corresponding ECC values and check (and correct, if necessary) the write data prior to such data values being written into an SPM portion. In addition, an error code generation circuit may generate error correction codes (ECC) from read data output from SPM portion, and provide the read data and ECC values on a port.

In a particular embodiment, data processing section 1178' may be formed with programmable circuits, thus enabling different error check and/or correction schemes to be implemented according to application.

While embodiments of the invention may include circuits for enabling multi-port communication with an SPM portion, other embodiments may additionally include circuits that control how (or if) an SPM portion is accessed via any of multiple ports. Two such embodiments will now be described with reference to FIGS. 12A and 12B.

Figure 12A:
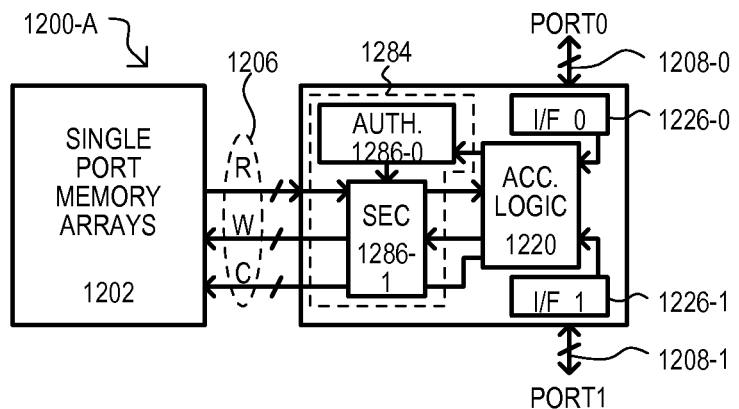
FIGS. 12A to 12C are block schematic diagrams of memory devices according to other embodiments.
Figure 12B:
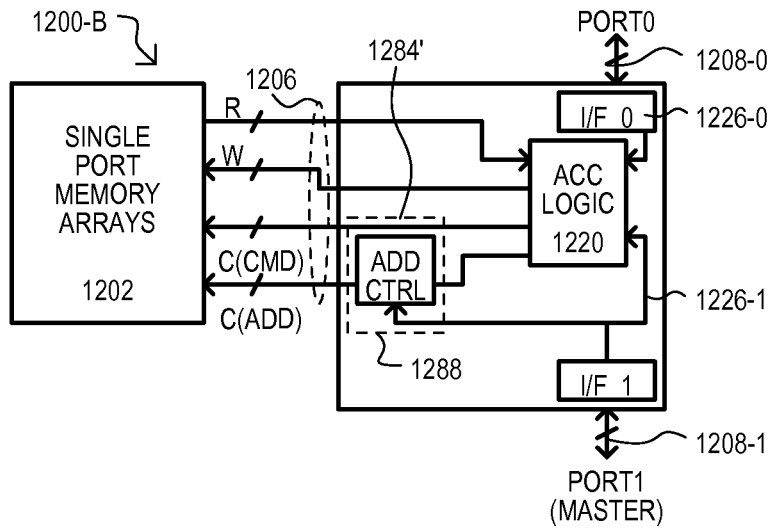
Figure 12C:
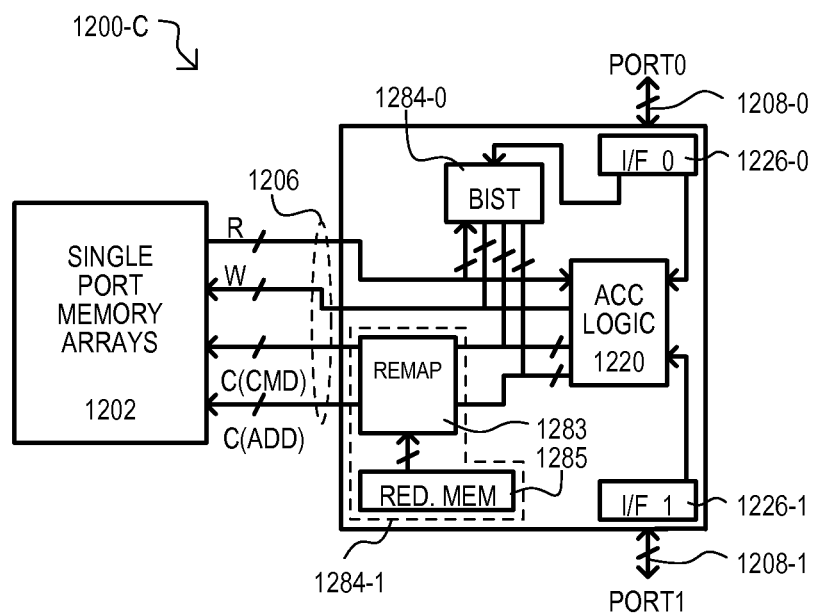

Referring now to FIGS. 12A to 12C, memory devices according to further embodiments are shown in block schematic diagrams and designated by the general reference characters 1200-A to 1200-C, respectively. Memory devices 1200-A to 1200-C may each include an SPM portion 1202 and a port expansion portion 1204. An SPM portion 1202 may take the form of SPM portions shown in other embodiments herein, and equivalents. Port expansion portions 1204 and 1204' may include I/F circuits 1226-0/1 and access logic 1220 as shown in other embodiments, or equivalents. Port expansion portions 1204 and 1204' may also include data access sections 1284, 1284' 1284-0 and/or 1284-1.

Referring to FIG. 12A, a data access section 1284 of memory device 1200 may include an authentication circuit 1286-0 and secure access path 1286-1. In one embodiment, an authentication circuit 1286-0 may execute an authentication operation on predetermined data with a secure key, or the like, and compare such an authentication result to a received authentication value from a device external to memory device 1200. If such values match, authentication circuit 1286-0 may enable secure access path 1286-1, thereby enabling accesses to SPM portion 1202. However, if authentication values do not match, authentication circuit 1286-0 may disable secure access path 1286-1, thereby preventing accesses to SPM portion 1202.

In a particular embodiment, data access section 1284 may be formed with programmable circuits, thus enabling different authentication schemes to be implemented according to application.

Referring to FIG. 12B, a data access section 1284' of memory device 1200' may include an address control circuit 1288. An address control circuit 1288 may logically partition areas of SPM portion 1202. In the embodiment shown, command and address data received from a port (e.g., 1208-0/1) may be altered by address control circuit 1288 to direct accesses to SPM locations. Further, an address control circuit 1288 may accessed through a "master" port (in this embodiment PORT1) to be placed in a particular configuration. According to such a configuration, port accesses may be restricted, including being unable to access particular sections of SPM portion 1202, or only being able to perform certain operations (e.g., reads and not writes) at particular locations within SPM portion 1202.

In a particular embodiment, data access section 1284' may be formed with programmable circuits, thus enabling different partitioning schemes to be implemented according to application. Referring to FIG. 12C, a data access section 1284 of memory device 1200 may include a built-in-self-test (BIST) circuit 1284-0 and/or a redundancy circuit 1284-1. A BIST circuit 1284-0 may execute self-test operations on SPM section 1202 over single port connection 1202. In the embodiment shown, BIST circuit 1284-0 may also be accessed over port 1208-0. In a very particular embodiment, a BIST circuit 1284-0 may write data into locations of SPM portion 1202 according test patterns, and then read such data and compare it to expected data values. Results of such tests may be output over 1208-0.

A redundancy circuit 1284-1 may include a remapping circuit 1283 and a redundancy memory 1285. A remapping circuit 1283 may compare a received address to known addresses of defective locations indicated by redundancy memory 1285, and access a redundant location instead of the defective location.

In a particular embodiment, data access sections 1284-0 and/or 1284-1 may be formed with programmable circuits, thus enabling different BIST or redundancy schemes to be implemented according to application.

In particular embodiments, the memory devices of FIGS. 11A to 12C may particular implementations of those shown in FIGS. 1A to 9. It is noted that the particular embodiments of FIGS. 11A to 12C show but a few of the possible different examples of functions that may be added by a port expansion. It is understood that other embodiments may include various other circuits.

In this way, a memory device may include an SPM portion and port expansion portion having data processing and/or data access circuits.

Embodiments of the invention may also include various methods. Examples of such embodiments will now be described with reference to a number of flow diagrams.

Figure 13:
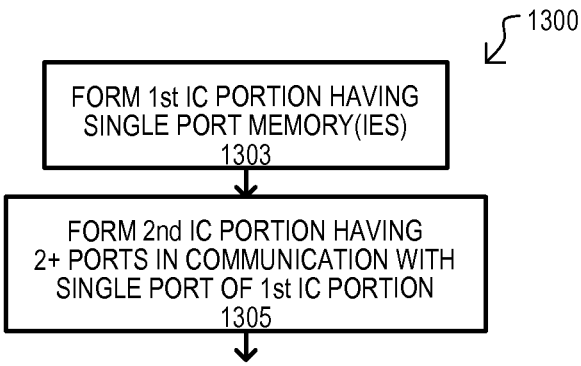
FIG. 13 is a flow diagram of a method according to an embodiment.

Referring to FIG. 13, a method 1300 according to one embodiment may include forming a first integrated circuit (IC) portion having one or more single port memories (box 1303). A method 1300 may also include forming a second IC portion having two or more ports in communication with a single port of the first IC portion (box 1305).

Figure 14:
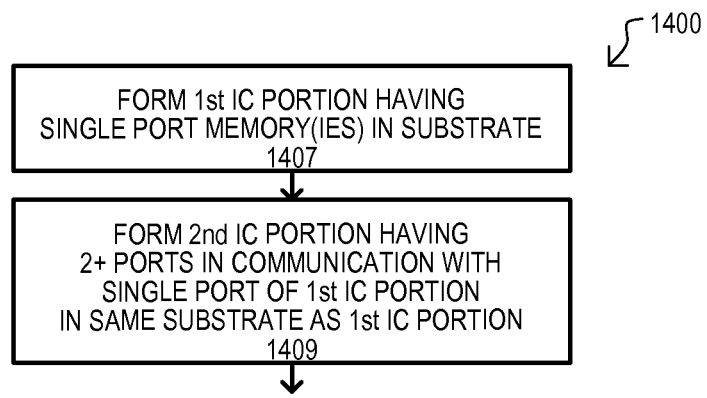
FIG. 14 is a flow diagram of a method according to a further embodiment.

Referring to FIG. 14, a method 1400 according to another embodiment may include forming a first IC portion having one or more single port memories in a substrate (box 1407). In addition, a second IC portion, having two or more ports in communication with a single port of the first IC portion, may be formed in the same substrate (box 1409).

Figure 15:
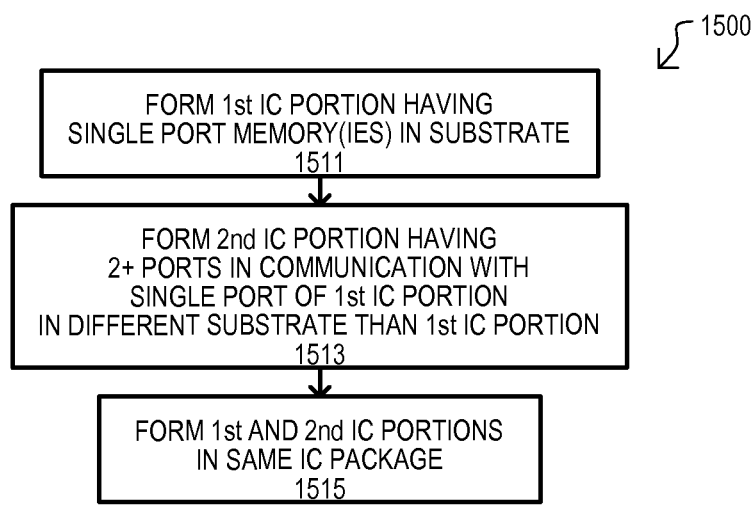
FIG. 15 is a flow diagram of a method according to yet another embodiment.

Referring to FIG. 15, a method 1500 according to another embodiment may include forming a first IC portion having one or more single port memories in a substrate (box 1511). A second IC portion having two or more ports in communication with a single port of the first IC portion may be formed in a different substrate (box 1513). The first and second IC portions may be formed in a same IC package (box 1515).

Figure 16:
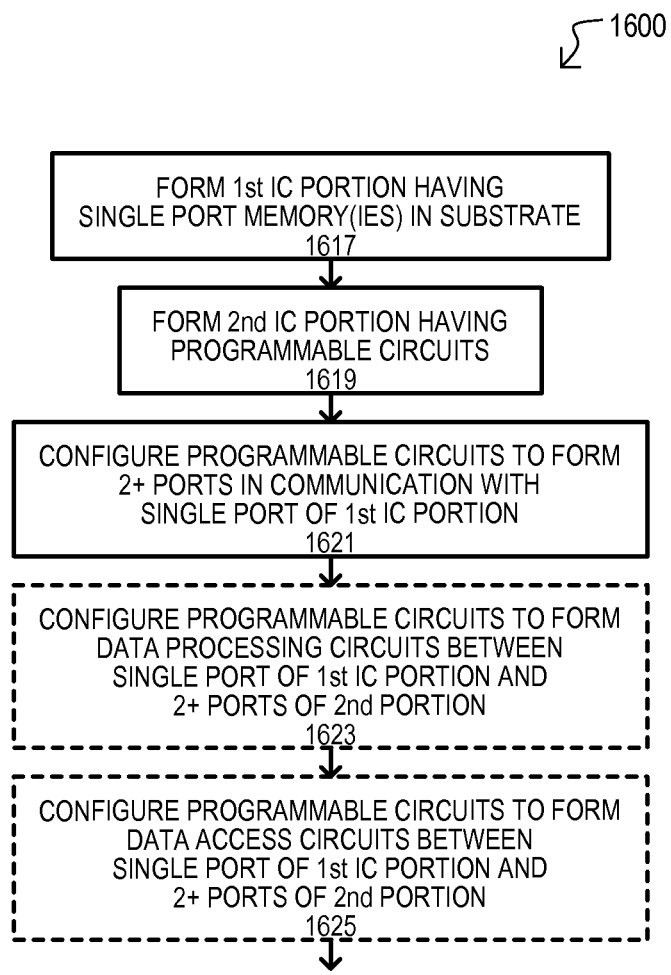
FIG. 16 is a flow diagram of a method according to an embodiment.

Referring now to FIG. 16, a method according to yet another embodiment is shown in a flow diagram and designated by the general reference character 1600. A method 1600 may include forming a first IC portion having one or more single port memories in a substrate (box 1617). A second IC portion may be formed that includes programmable circuits (box 1619). Programmable circuits may be configured to form two or more ports in communication with a single port of the first IC portion (box 1621). Optionally, a method 1600 may include configuring programmable circuits to form data processing circuits between the single port of the 1$^{st}$ IC portion and the two or more ports of the second IC portion (box 1623). In addition or alternatively, a method 1600 may optionally include configuring programmable circuits to form data access circuits between the single port of the 1$^{st}$ IC portion and the two or more ports of the second IC portion (box 1625).

Figure 17:
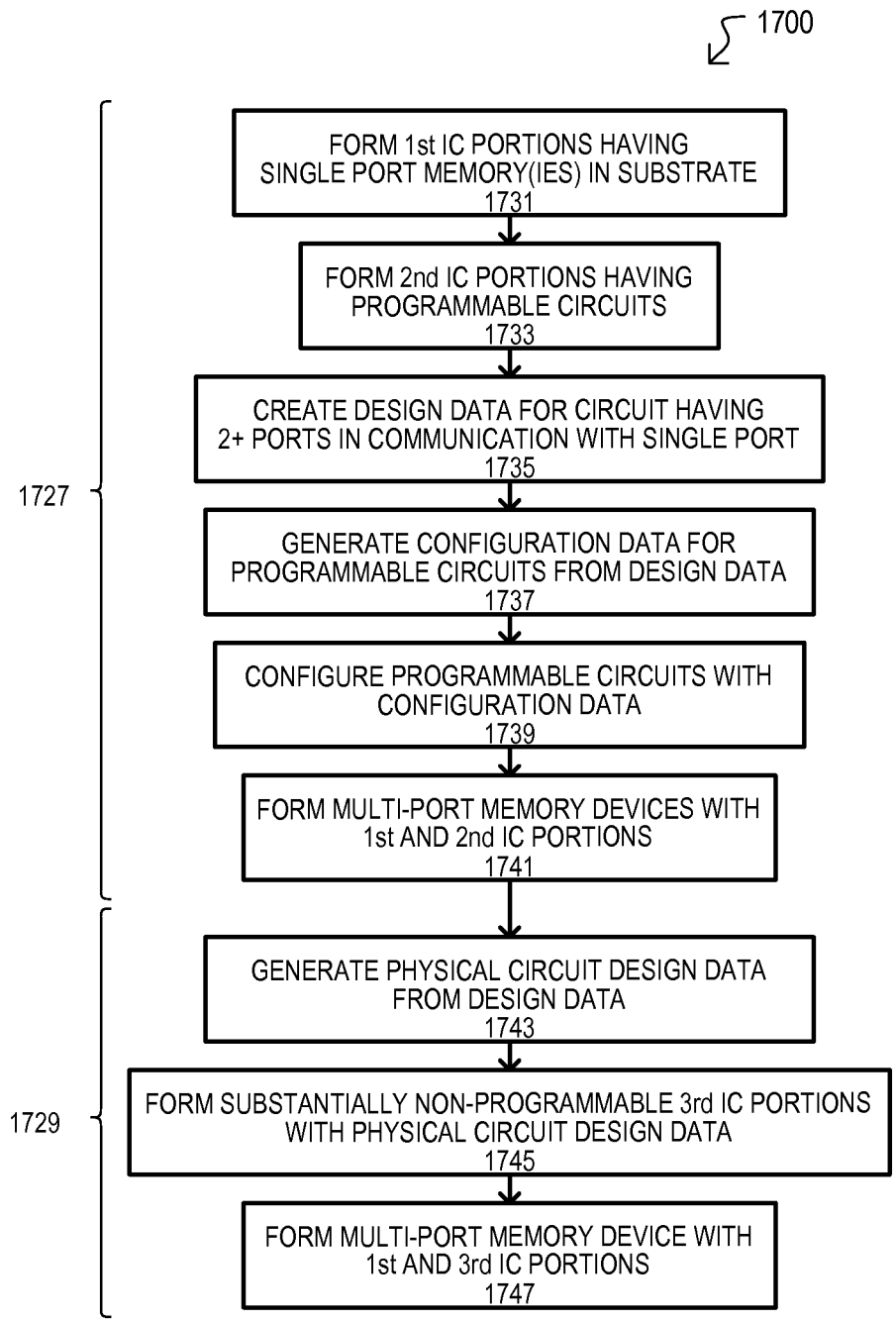
FIG. 17 is a flow diagram of a method according to an embodiment.

Referring to FIG. 17, a further method according to an embodiment is shown in flow diagram and designated by the general reference character 1700. A method 1700 may include a programmable device portion 1727 and a substantially non-programmable device portion 1729. A programmable device portion 1727 may include forming first IC portions having one or more single port memories in a substrate (box 1731). Second IC portions may be formed that includes programmable circuits (box 1733). Design data may then be created for a circuit having 2+ ports in communication with a single port (box 1735). Configuration data may then be generated form the design data that is compatible with the programmable circuits of the second IC portion (box 1737). Programmable circuits may then be programmed with the configuration data (box 1739). Multi-port memory devices may be formed with first and second IC portions (box 1741).

In this way, multi-port memory device may be formed with IC portions having programmable circuits.

Referring still to FIG. 17, a substantially non-programmable device portion 1729 may include generating physical circuit design data from the design data used to program the programmable circuits (box 1743). Third IC portions may then be formed with the physical circuit design data (box 1745). Multi-port memory devices may be formed with first and third IC portions (box 1747).

In this way, multi-port memory device may be formed with one IC portion having an SPM memory, and another IC portion with a circuit design used to program other devices.

Figure 18:
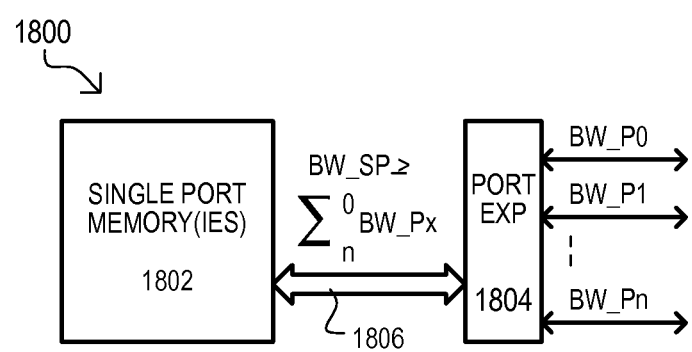
FIG. 18 is a block schematic diagram of a memory device according to another embodiment.

Referring now to FIG. 18, another multi-port memory device according to a further embodiment is shown in a block schematic diagram and designated by the general reference character 1800. In the particular embodiment shown, a port expansion portion 1804 may include "n+1" ports, each of which may transmit data at a maximum bandwidth BW_Px, (where "x" is a port number). Bandwidth values BW_Px, may be the same or may be different.

An SPM section 1802 may be capable of a bandwidth (BW_SP) with respect to port expansion portion 1804 equal to or greater than a total of all the maximum bandwidths of the ports together.

In this way, a bandwidth between a single memory section and a port expansion portion may be greater than or equal to the bandwidth on all ports together.

Figure 19:
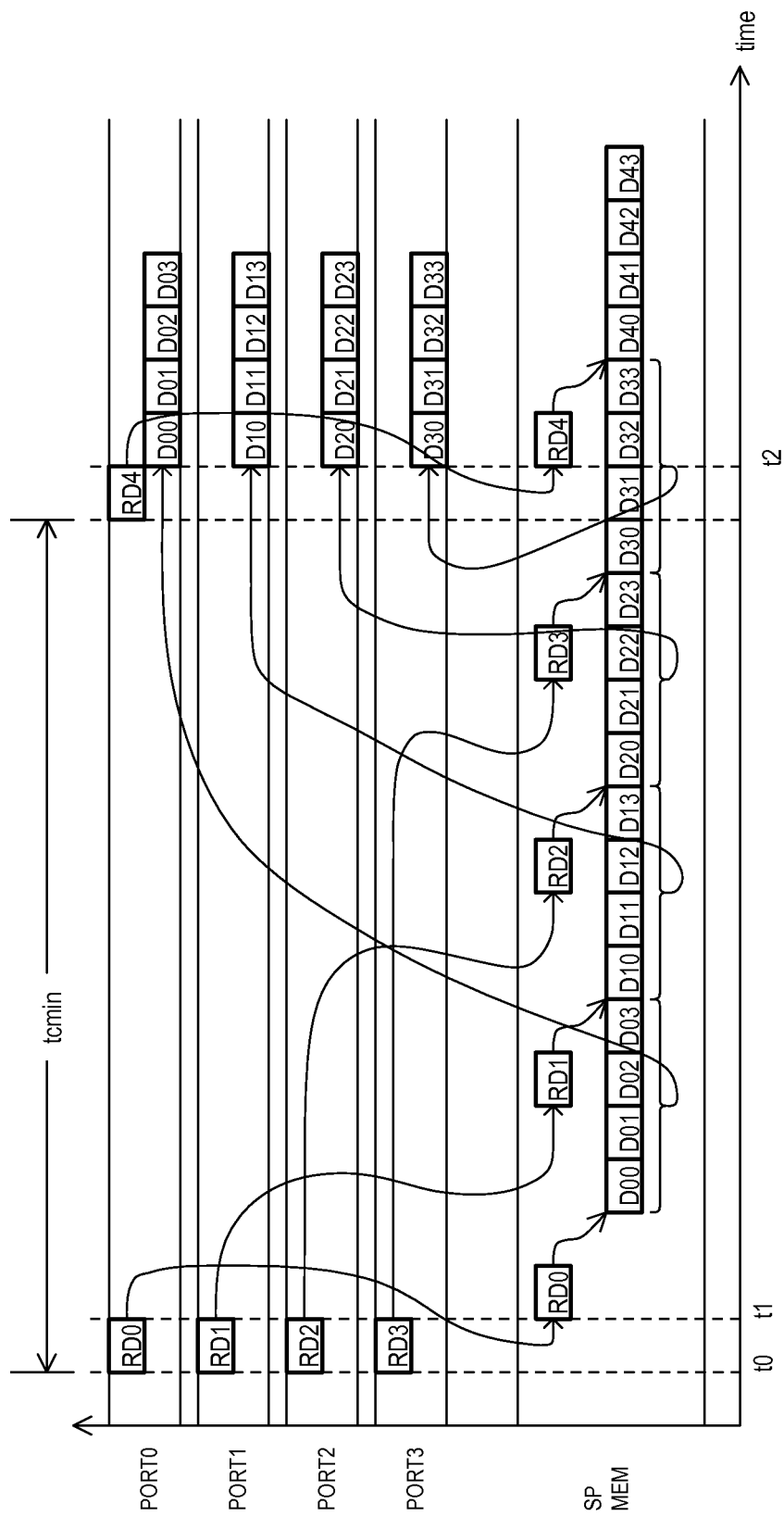
FIG. 19 is a timing diagram showing multi-port memory accesses according to one particular embodiment.

Referring now to FIG. 19, a timing diagram shows one very particular example of read latency in one very particular embodiment. The timing diagram of FIG. 19 shows commands and data on four different ports (PORT0 to PORT3), as well as operations within an SPM portion (SP MEM) accessed by such ports.

FIG. 19 shows a minimum time between commands (tcmin) for each port, and how such a value may be selected according to a worst case port access case. In the embodiment shown it is assumed that each port may read data in four value bursts. Thus, a worst case read access may result when all ports request a four value burst substantially simultaneously. As shown, a value tcmin may be selected to ensure that the SPM portion may service such a worst case request before outputting data for a subsequent request.

In particular, at time t0 each port may receive a four burst read request (RD0 to RD3).

Starting at time t1, such read requests may serviced within SPM portion in a sequence RD0, RD1, RD2, RD3 to output four data bursts in a corresponding sequence (D00-D03, D10-D13, D20-D23, D30-D33).

A port expansion portion may provide such data values on the ports at about time t2.

As shown, to ensure an SPM portion has sufficient bandwidth to service the request, a second read request on PORT0 may be issued until after a time tcmin.

Figure 20:
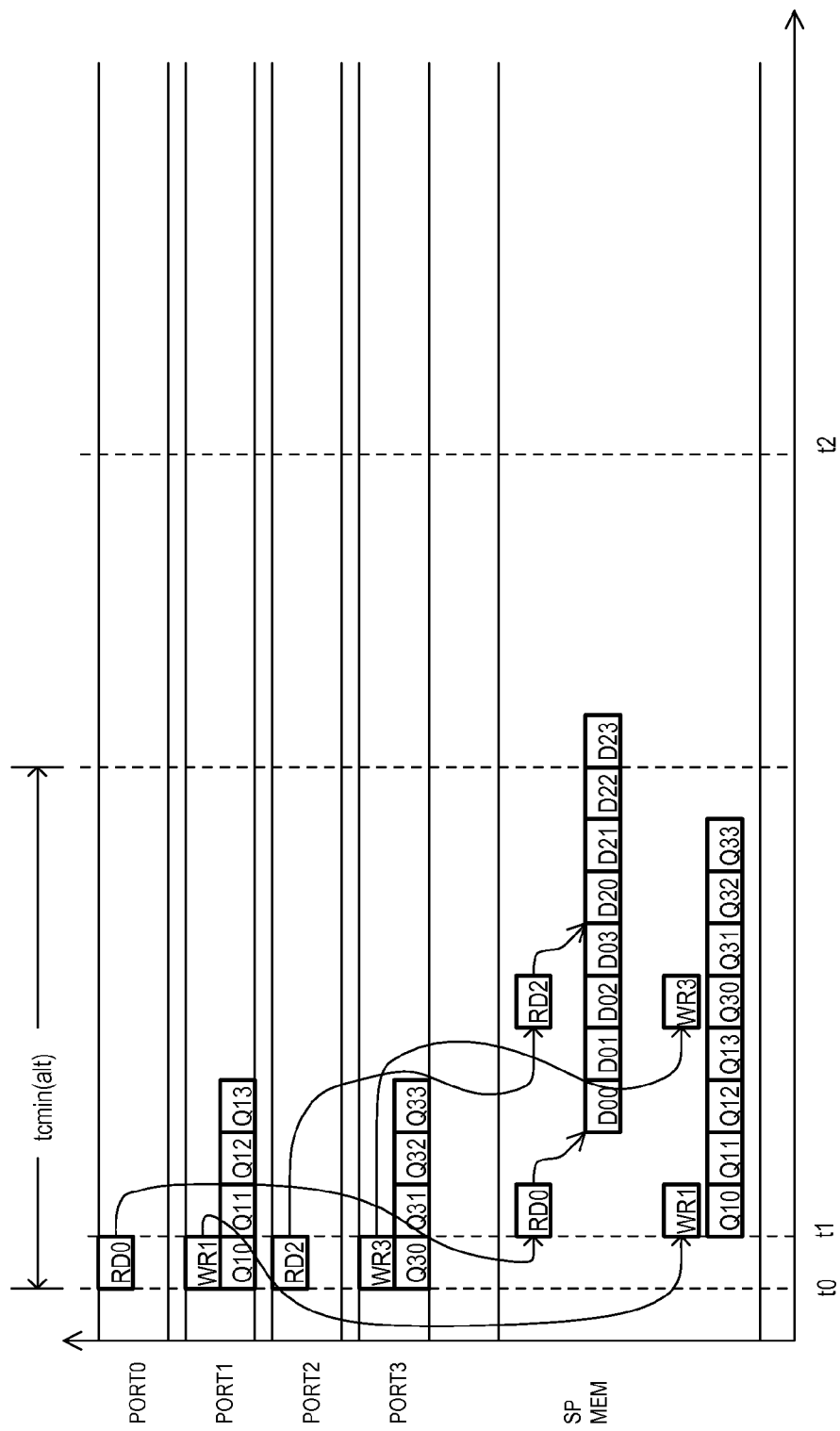
FIG. 20 is a timing diagram showing multi-port memory accesses according to another particular embodiment.

Referring now to FIG. 20, a timing diagram shows one very particular example of an alternate read latency in one very particular embodiment. The timing diagram of FIG. 20 shows the same ports and SPM portion as FIG. 19. However, unlike FIG. 19, two ports (PORT1 and PORT3) may receive write commands at time to.

FIG. 20 shows an example of a SPM portion that may be a quad data rate type memory device in which write requests may be serviced concurrently with read requests. Accordingly, if port accesses types are varied (e.g., at least one port writes or is idle) a minimum time between commands may be reduced.

Figure 21:
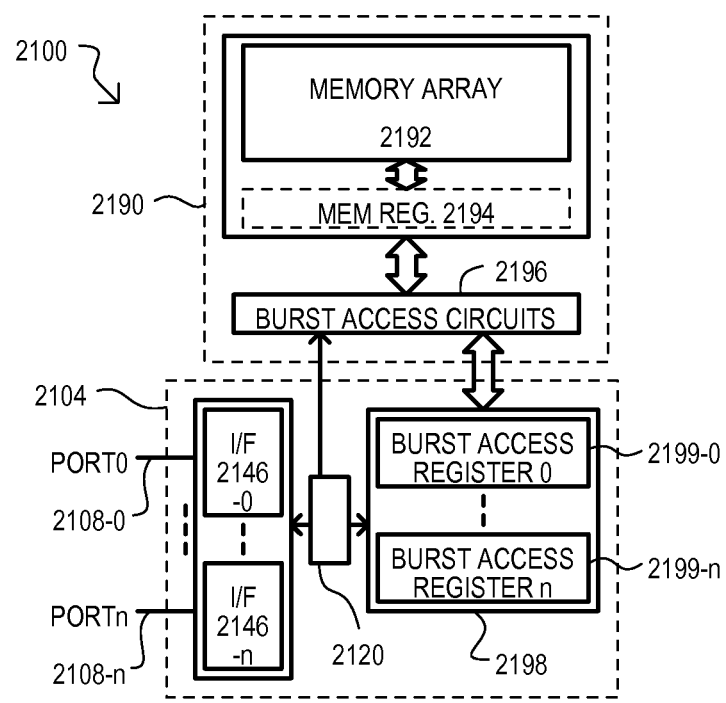
FIG. 21 is a block schematic diagram of a memory device according to a further embodiment.

Referring now to FIG. 21, an integrated circuit device according to another embodiment is shown in a block schematic diagram and designated by the general reference character 2100. The embodiment of FIG. 21 may be one very particular implementation of that shown in FIG. 1.

A device 2100 may include a burst access memory portion 2190 and a port expansion portion 2104. A burst access memory portion 2190 may include a memory cell array 2192, burst access circuits 2196, and optionally, memory registers 2194. A memory cell array 2192 may include storage locations that store data in data units. A data unit may be a multi-bit data value, such as a byte (8-bits), word (16-bits), double word (32-bits), or larger values. Burst access circuits 2196 may transfer data units in bursts between memory cell array 2192 and port expansion portion 2104. Such a burst access may access related addresses sequentially in an automated fashion. In one embodiment, related addresses may include a base address and one or more next numerical addresses. However, other embodiments may generate an address sequence according to other sequences, and may include operations on an address (e.g., adding/subtracting an offset, hashing function, etc.). Accordingly, a burst access may access a number of addressable locations based on a single base address.

Optional memory registers 2194 may store multiple data units received in a burst sequence from burst access circuits 2196 for subsequent writing into memory cell array 2192. In addition or alternatively, memory registers 2194 may store multiple data units for subsequent output with a burst sequence from burst access circuits 2196.

A port expansion portion 2104 may include two or more ports 2108-0 to -n, interfaces 2146-0 to -n corresponding to the ports, access logic 2120, and a register section 2198. Ports (2108-0 to -n) and interfaces (2146-0 to -n) may take the form of embodiments shown above, or equivalents. Access logic 2120 may provide control signals to burst access memory portion 2190 and register section 2198.

A register section 2198 may include a number of burst access registers 2199-0 to -n, with one or more such registers corresponding to each port (2108-0 to -n). Burst access registers (2199-0 to -n) may each include storage locations for at least a burst sequence of data units, as well as other values as will be described in more detail below. Data transfers between each burst access register (2199-0 to -n) and a corresponding port (2108-0 to -n) may be by single data units, in non-burst accesses. That is, one data unit may be received according to one address value. In contrast, data transfers between each burst access register (2199-0 to -n) and burst access memory portion 2190 may be according to bursts (sequences of two or more) of data units.

In this way, an integrated circuit device may include a first IC portion having memory locations accessed according to burst accesses, a second IC portion with registers that access ports in non-burst accesses, but access the first IC portion with burst accesses.

Figure 22:
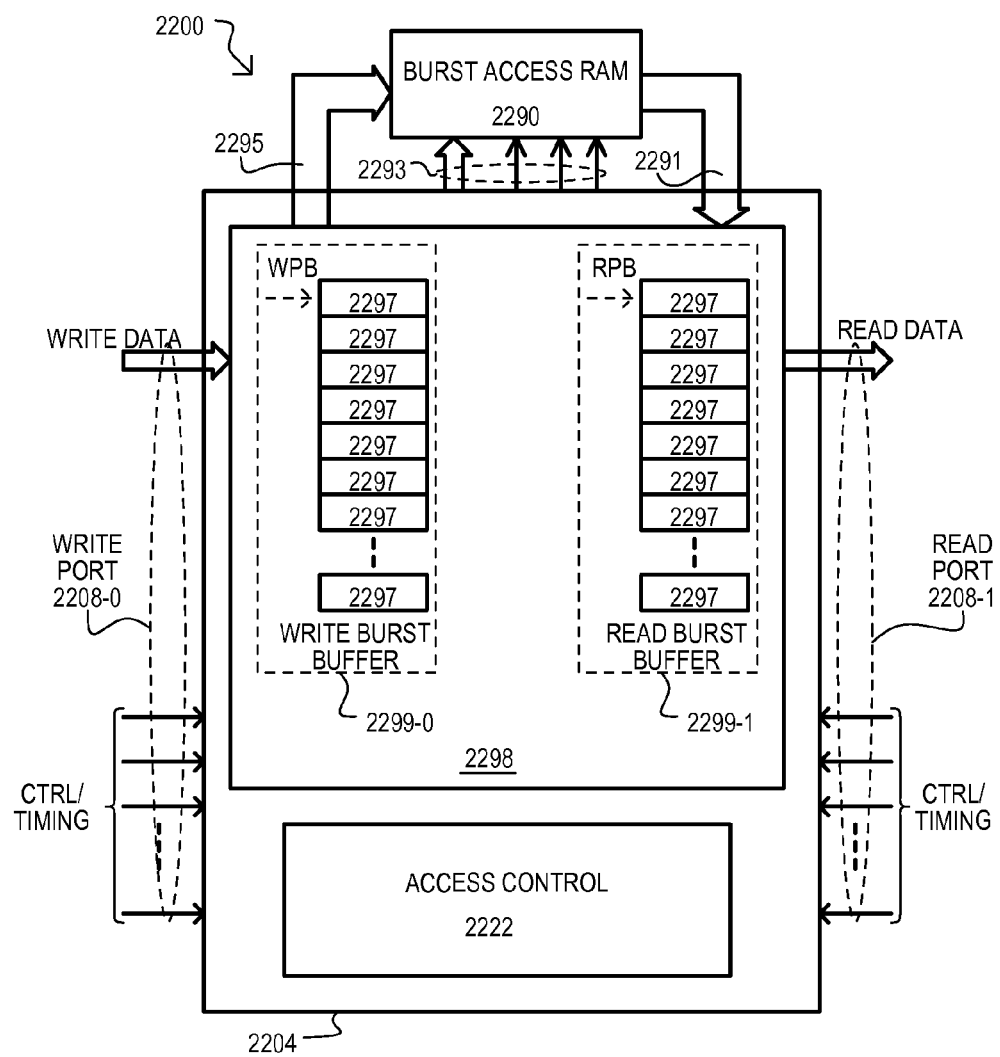
FIG. 22 is a block diagram of a first-in-first-out (FIFO) memory device according to an embodiment.

Referring now to FIG. 22, an integrated circuit device according to a further embodiment is shown in a block diagram and designated by the general reference character 2200. The embodiment of FIG. 22 may be one very particular implementation of that shown in FIG. 21. A device 2200 may be a first-in-first-out (FIFO) memory device that may output single data units at a read port 2208-1 in the same order that such data units are received at a write port 2208-0.

A device 2200 may include a burst access memory portion 2290 connected to a port expansion portion 2204 by a write data path 2295, address/control path 2293, and a read data path 2291. In one embodiment, a write data path 2295 may be different from a read data path 2291. However, in other embodiments, such paths may be the same (e.g., a bi-directional data bus).

Port expansion portion 2204 may include a register section 2298 and an access control circuit 2222. A register section 2298 may include a write burst buffer 2299-0 and a read burst buffer 2299-1. A write burst buffer 2299-0 may receive data units, in single, non-burst accesses via write port 2208-0. Such data units may be stored in register storage locations 2297. Data units stored in storage locations 2297 may be transferred to storage locations within burst access memory portion 2290 with a burst write operation that sequentially transfers data units on write data path 2295.

A read burst buffer 2299-1 may receive read data with burst read operations that sequentially transfer data units stored in burst access memory portion 2190 on read data path 2291 to corresponding storage locations 2297 within read burst buffer 2299-1. Read burst buffer 2299-1 may output data units, in single, non-burst accesses via read port 2208-1.

Access control circuit 2222 may receive control and timing signals from write and read ports (2208-0/1), and control access to write and read burst buffers (2299-0/1). In addition, access control circuit 2222 may generate control and address signals on address/control path 2293. Access control to write burst buffer 2299-0 may include generating one or more write buffer "pointers" (WPB) that identify a particular storage location 2297 within write burst buffer 2299-0. In a similar fashion, access control to read burst buffer 2299-1 may include generating one or more read write buffer "pointers" (RPB) that identify a particular storage location 2297 within read burst buffer 2299-0.

In this way, a FIFO memory device may include a write buffer that accumulates data units in single access operations and then burst writes such data units into a memory portion. In addition or alternatively, a FIFO memory device may include a read buffer that receives data units in burst read operations from the memory portion then outputs such data units in single access operations.

Referring now to FIGS. 23A to 23H, write operations for a FIFO memory device like that of FIG. 22 are shown in a sequence of block diagrams. FIGS. 23A to 23H show a FIFO memory device 2300 having a burst access memory portion 2390 and write burst buffer 2399-0. Such sections may be like those shown as 2290 and 2299-0, respectively, in FIG. 22. In addition, a write buffer pointer (WBP) and pointer trigger 2387 are shown. A write buffer pointer WPB may point to a storage location (e.g., any of 2397-0 to -7) to which an incoming write data unit is to be stored. A pointer trigger 2387 represents a pointer position that may result in a burst write of data currently stored within write burst buffer 2399-0.

Figure 23A:
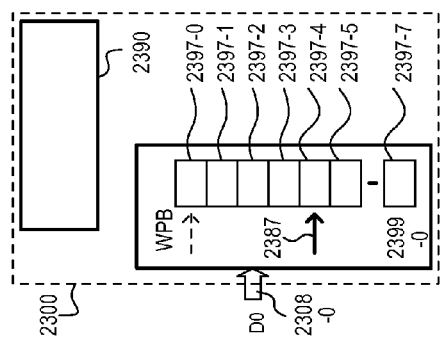
FIGS. 23A to 23H are a sequence of block diagrams showing FIFO device write operations according to an embodiment.

Referring to FIG. 23A, initially a WBP points to a storage location 2397-0. In addition, pointer trigger 2387 corresponds to storage location 2397-4. A write data unit D0 is received at write port 2308-0.

Figure 23B:
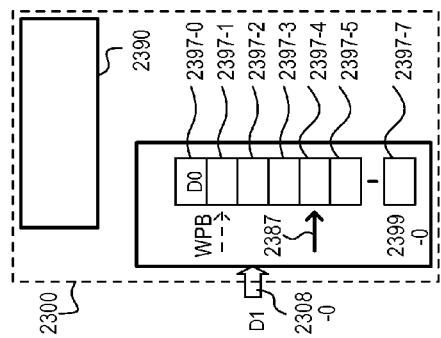

Referring to FIG. 23B, data unit D0 is stored at storage location 2397-0, and WBP advances to storage location 2397-1. Pointer trigger 2387 continues to correspond to storage location 2397-4. A next write data unit D1 is received at write port 2308-0.

Figure 23C:
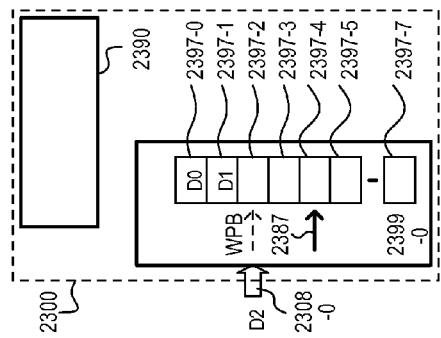
Figure 23D:
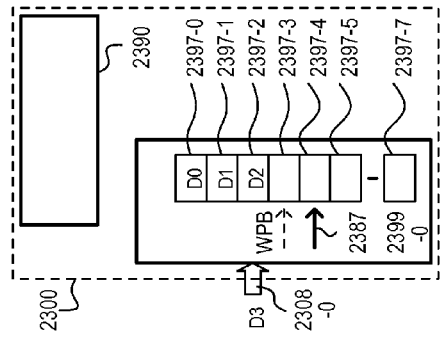
Figure 23E:
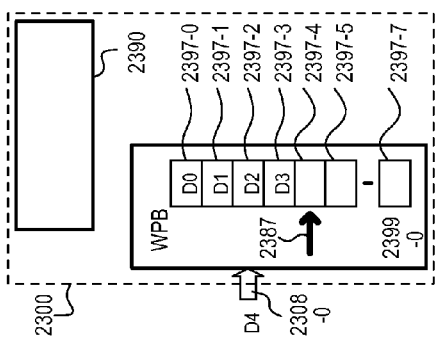

Referring to FIGS. 23C to 23E, data units are stored and a WBP pointer advanced in the same fashion, until WPB corresponds to pointer trigger 2387, represented by the bold arrow in FIG. 23E.

Figure 23F:
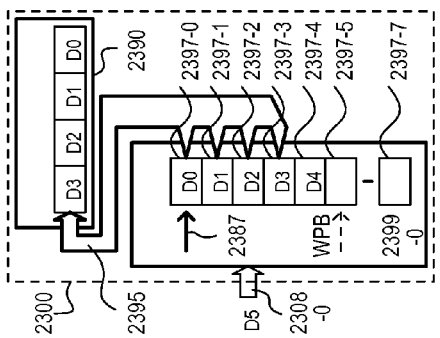

Referring to FIG. 23F, in response to a WBP value corresponding to pointer trigger, a burst write operation may occur, storing data units D0, D1, D2 and D3 within burst access memory portion 2390 by way of a write data path 2395. It is understood that such a burst write occurs in a sequential fashion, with data units D0-D3 following one another (though not necessarily in a particular numerical order). In addition, a pointer trigger 2387 is advanced to a next location. Because a write burst buffer 2399-0 is circular buffer, such a location may correspond to storage location 2397-0.

Figure 23G:
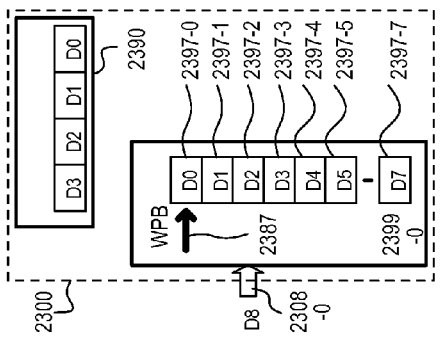

Referring to FIG. 23G, data values D4-D7 may be received in single unit data transfers and stored by advancing a WBP as described above, until the WBP once again corresponds to pointer trigger 2387, as shown in FIG. 23G.

Figure 23H:
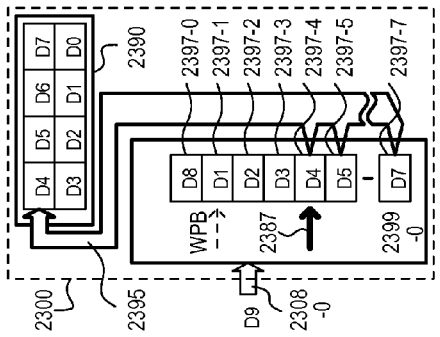

Referring to FIG. 23H, in response to a WBP value corresponding to the pointer trigger, a burst write operation may occur once again, storing data values D4-D7 within burst access memory portion 2390, and a pointer trigger 2387 may be advanced once again.

Such operations may repeat to accumulate data units one-by-one, and then burst write them into a memory portion.

In this way, a FIFO memory device may have a write buffer pointer, and burst write data values to memory locations when the write buffer pointer advances a predetermined amount and/or predetermined number of times.

Referring now to FIGS. 24A to 24C, read operations for a FIFO memory device like that of FIG. 22 are shown in a sequence of block diagrams. FIGS. 24A to 24C show a FIFO memory device 2400 having a burst access memory portion 2490 and read burst buffer 2499-1. Such sections may be like those shown as 2290 and 2299-1, respectively, in FIG. 22. In addition, a read buffer pointer (RBP) and pointer trigger 2487 are shown. A read buffer pointer RBP may point to a storage location (e.g., any of 2497-0 to -7) from which a stored data unit is to be output on a read port 2408-1. A pointer trigger 2487 represents a pointer position that may result in a burst read of data stored in burst access memory portion 2490 into read burst buffer 2499-1.

Referring to FIG. 24A, a burst access memory portion 2490 may store a number of data units shown as D0 to D11. Previous burst read operations (and or "fall through" operations described below), may result in data units D0 to D7 being stored in storage locations 2497-0 to -7. Initially a RBP points to a storage location 2497-0. In addition, pointer trigger 2487 corresponds to storage location 2497-4. In response to the RBP, data unit D0 stored at storage location 2497-0 may be output in a non-burst, singe data unit read operation at read port 2408-1.

Referring to FIG. 24B, data units may continue to be output and RBP pointer advanced in the same fashion.

Referring to FIG. 24C, in response to a RBP value corresponding to pointer trigger 2487 (represented by a bold arrow), a burst read operation may occur. In the example shown, such a burst read operation reads data units D8, D9, D10 and D11 stored within burst access memory portion 2490, via read data path 2491 into storage locations 2497-0 to -3, respectively. It is understood that such a burst read occurs in a sequential fashion, with data units D8-D11 following one another (though not necessarily in a particular numerical order). In addition, a pointer trigger may be advanced to a next location (not shown).

Such operations may repeat to accumulate data units in burst read operations from a memory portion, and output them one-by-one on a read port.

In this way, a FIFO memory device may have a read buffer pointer, and burst read data values to buffer locations when the read buffer pointer advances a predetermined amount and/or predetermined number of times.

Referring now to FIGS. 25A to 25E, a "fall through" operation of a FIFO memory device like that of FIG. 22 according to one embodiment is shown in a sequence of block diagrams. A "fall through" operation may allow one or more initial data units to be read out of a burst buffer.

FIGS. 25A to 25E show a FIFO memory device 2500 having a burst access memory portion 2590, a write burst buffer 2599-0, and a read burst buffer 2599-1. Such sections may be like those shown as 2290, 2299-0 and 2299-1, respectively, in FIG. 22.

FIGS. 25A to 25E also show a read buffer pointer (RBP), write pointer buffer (WPB), write pointer trigger 2587-0, and read pointer trigger 2587-1, which may operate as described in embodiments above.

Referring to FIG. 25A, a write burst buffer 2599-0 may receive an initial data unit D0, and store it in a location indicated by write buffer pointer WBP.

Referring to FIG. 25B, unlike previously described write operations, an initial data unit D0 may be output through read port 2508-1, without being written as part of burst sequence into a burst access memory portion 2590 (not shown in FIGS. 25A and 25B). Such a read operation may be directly from write burst buffer 2599-0, or alternatively, from write burst buffer 2599-0 through read burst buffer 2599-1. In one particular embodiment, a read buffer pointer (RPB) may have an initial value, signifying that no data units have yet been read into the read burst buffer 2599-1. At the same time, additional data units D1-D3 may continue to be accumulated within write burst buffer 2599-0.

Referring to FIG. 25C, in response to a WBP value corresponding to pointer trigger 2587-0 (represented by a bold arrow), a burst write operation may occur, writing data units D1-D4 into burst access memory portion 2590. Data units (e.g., D5) may continue to be accumulated within write burst buffer 2599-0.

Referring to FIG. 25D, as data units (e.g., D6) continue to be accumulated, a burst read operation may burst write data values D1-D4 from burst access memory portion 2491 into read burst buffer 2599-1.

Referring to FIG. 25E, in response to receiving a first read burst of data, a RBP may point to a first storage location (corresponding to data unit D1), and subsequent read operations may read single data units, one-by-one, from read burst buffer 2599-1. In addition, a read pointer trigger 2587-1 may be set to an appropriate storage location (corresponding to data unit D4, in the embodiment shown).

Referring now to FIGS. 26A to 26D, "fall through" operations of a FIFO memory device like that of FIG. 22 according to another embodiment is shown in a sequence of block diagrams.

FIGS. 26A to 26D show a FIFO memory device 2600 having a burst access memory portion 2690, a write burst buffer 2699-0, and a read burst buffer 2699-1. Such sections may be like those shown as 2290, 2299-0 and 2299-1, respectively, in FIG. 22.

FIGS. 26A to 26D also show a read buffer pointer (RBP), write pointer buffer (WPB), write pointer trigger 2687-0, and read pointer trigger 2687-1, which may operate as described in embodiments above.

Referring to FIG. 26A, an initial data unit D0 may be received at a write port 2608-0. Unlike previously described write operations, an initial data unit D0 may be stored in read burst buffer 2699-1 without being written as part of burst sequence into a burst access memory portion 2690 (not shown in FIGS. 26A and 26B). Such a storing of initial data unit D0 may be directly to read burst buffer 2699-1 from write port 2608-0, or alternatively, through write burst buffer 2699-0. In one particular embodiment, a write buffer pointer (WPB) may have an initial value, signifying that only initial data unit(s) have been received. A read buffer pointer (RPB) and read pointer trigger 2687-1 may be established as described in above embodiments.

Referring to FIG. 26B, in response to receiving an initial data unit(s) D0, a WPB and write pointer trigger 2687-0 may be established. Thus, write data units may start to be accumulated within write burst buffer 2699-0. As shown in FIG. 26B, a received data unit D1 may be stored as indicated by WBP, and not directly stored in read burst buffer 2699-1.

Referring to FIG. 26C, in response to a WBP value corresponding to write pointer trigger 2687-0 (represented by a bold arrow), a burst write operation may occur, writing data units D1-D4 into burst access memory portion 2690. Data units (e.g., D5) may continue to be accumulated within write burst buffer 2699-0.

Referring to FIG. 26D, as data units (e.g., D6) continue to be accumulated, a burst read operation may burst write data values D1-D4 from burst access memory portion 2490 into read burst buffer 2699-1. In the particular embodiment shown, initial data unit D0 may be read out on read data path 2608-1. Consequently, RBP may advance to a next storage location (corresponding to data unit D1, in the embodiment shown). Subsequent read operations may continue reading single data units, one-by-one, from read burst buffer 2699-1.

While the embodiment shows the fall through of a first initial data unit (D0), alternate embodiments may allow larger numbers of data units to be read from a burst register without being written to a memory portion in a burst write access.

Figure 27:
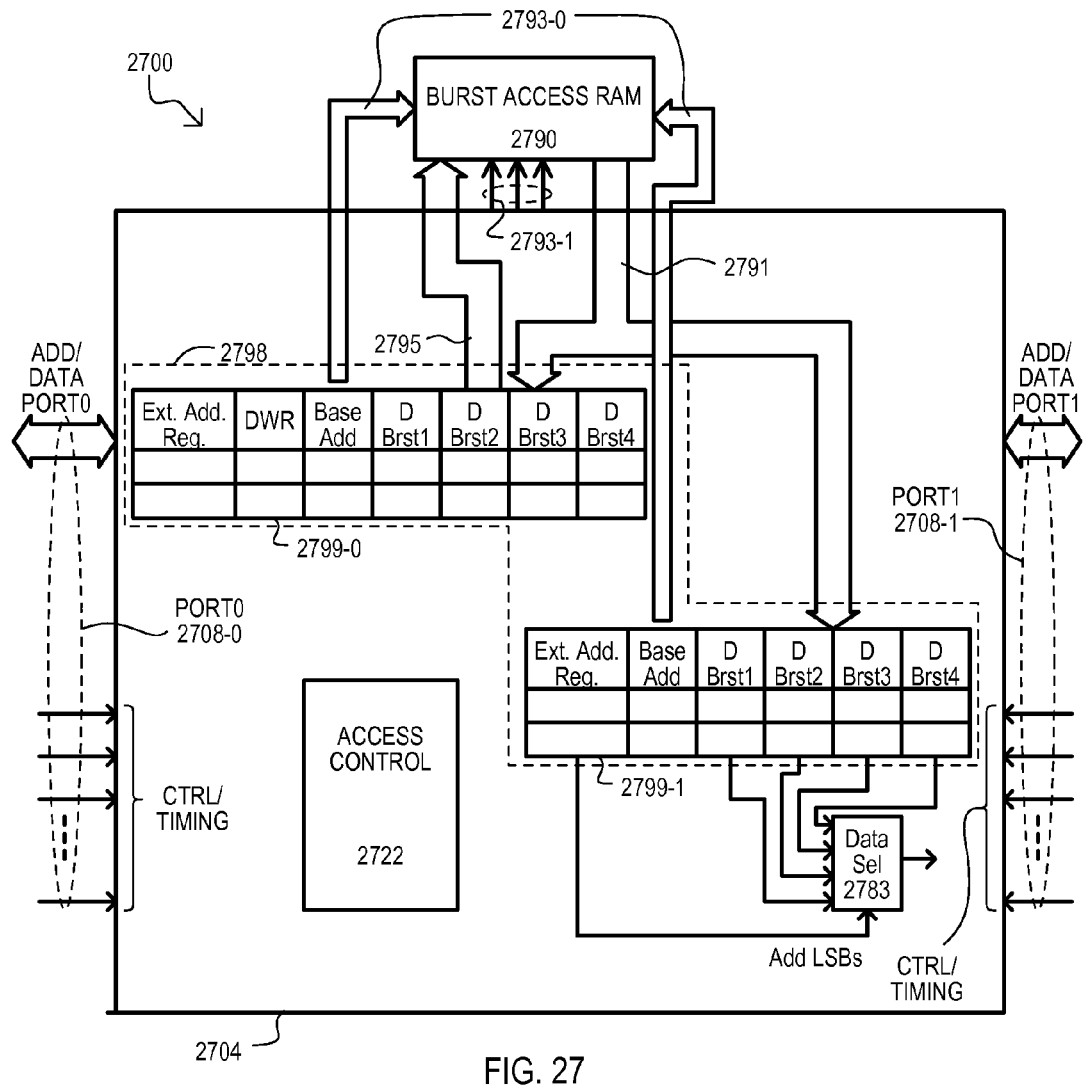
FIG. 27 is a block diagram of a multi-port memory device according to an embodiment.

Referring now to FIG. 27, an integrated circuit device according to a further embodiment is shown in a block diagram and designated by the general reference character 2700. The embodiment of FIG. 27 may be one very particular implementation of that shown in FIG. 21. A device 2700 may be a multi-port memory device that may read or write single data units at any of multiple ports (two shown as 2708-0/1).

A device 2700 may include a burst access memory portion 2790 connected to a port expansion portion 2704 by a write data path 2795, address path 2793-0, control path 2793-1, and a read data path 2791. As in the case of FIG. 22, in one embodiment, a write data path 2795 may be different from a read data path 2791. However, in other embodiments, such paths may be the same (e.g., a bi-directional data bus).

Port expansion portion 2704 may include a register section 2798 and an access control circuit 2722. A register section 2798 may include write access registers 2799-0 connected to each port (e.g., 2708-0/1), as well as read access registers 2799-1 connected to each port (e.g., 2708-0/1). Thus, unlike the FIFO device, write and read access registers 2799-0/1 are common to each port.

A write access register 2799-0 may include particular storage locations accessed when a write operation occurs at a particular port. In the embodiment shown, each write register for a given port may include an external address store location (Ext. Add. Reg.), a write data store location (DWR), burst data store locations (DBrst1 to Dbrst4), and optionally, a base address store location (Base Add). A write address received at a port (e.g., 2708-0 or -1) in a non-burst access may be stored in location Ext. Add. Reg. Similarly, a write data unit received at a port (e.g., 2708-0 or -1) in a non-burst access may be stored in location DWR. In addition, data units stored in storage locations DBrst1 to Dbrst4 may be transferred to storage locations within burst access memory portion 2790 with a burst write operation. In addition, data units stored in burst access memory portion 2790 may be burst read into storage locations DBrst1 to Dbrst 4.

A read access register 2799-1 may include particular storage locations accessed when a read operation occurs at a particular port. In the embodiment shown, each read register for a given port may include an external address store location (Ext. Add. Reg.), burst data store locations (DBrst1 to Dbrst4), and optionally, a base address store location (Base Add). A read address received at a port (e.g., 2708-0 or -1) in a non-burst access may be stored in location Ext. Add. Reg. Data units stored in burst access memory portion 2790 may be burst read into storage locations DBrst1 to Dbrst 4 of read access registers 2799-1.

Access control circuit 2722 may receive control and timing signals from ports (2708-0/1), and control access to write and read access registers (2799-0/1). In addition, access control circuit 2722 may generate control signals on control path 2793-1, and apply addresses on address path 2793-0 from values stored in read and write access registers 2799-0/1. Access control circuit 2722 may also selectively modify values stored in storage locations DBrst1-4 of write access registers 2799-0.

In the embodiment shown, a port expansion portion 2704 may also include a data selector circuit 2783. A data selector circuit 2783 may output one data unit from those stored in locations DBurst1-4 of read access registers 2799-1.

In this way, a multi-port memory device may include write access registers that may receive data in single units from ports, but write data units in bursts to a memory portion. In addition or alternatively, a multi-port memory device may include read access registers that receive read data units in bursts from a memory portion, but output single read data units on ports, in non-burst accesses.

Figure 28:
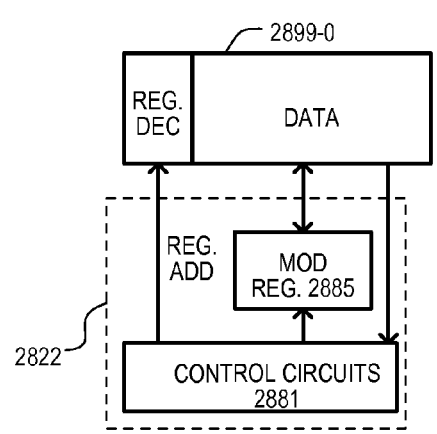
FIG. 28 is a block schematic diagram showing modify operations that may be performed in an embodiment like that of FIG. 27.

Referring now to FIG. 28, modification circuits according to an embodiment is shown in a block schematic diagram. Modification circuits may include a write access register 2899-0 and an access control circuit 2822. In one embodiment, such items may correspond to those shown as 2799-0 and 2722 in FIG. 27.

Access control circuit 2822 may include control circuits 2881 that generate register address values REG. ADD that may be applied to write access register 2899-0 to access particular storage locations therein for write and/or read operations. A modification register 2885, controlled by control circuits 2881, may serve as a temporary store to store data values read from write access register.

In one particular operation, control circuits 2881 may read at least a portion of write address value (value at storage location Ext. Add. Reg.) and read a write data unit (data unit stored at location DWR) into modification register 2885. According to the address value portion, control circuit 2881 may write the write data unit from modification register 2885 into one of the storage locations DBrst1-4 of the same write access register 2899-0, thus over-writing any data unit value stored at the location.

In this way, one data unit from a sequence of data units stored in a write access register may be modified according to a received write data unit.

Referring now to FIGS. 29A to 29D, write operations for a multi-port memory device like that of FIG. 27 are shown in a sequence of block diagrams. FIGS. 29A to 29D show a multi-port memory device 2900 having a burst access memory portion 2990 and a write burst buffer 2999-0. Such sections may be like those shown as 2790 and 2799-0, respectively, in FIG. 27.

Referring to FIG. 29A, in response to a write operation, a write address ([ADDx]:[1:0]) and write data unit Dz may be received. The write address ([ADDx]:[1:0]) may be stored in storage location Ext. Add. Reg. corresponding to the port receiving the write request. Write data unit Dz may be stored in location DWR corresponding to the port receiving the write request. In the embodiment shown, a write address ([ADDx]:[1:0]) may include a base address portion [ADDx] and a burst portion[1:0]. A base address portion [ADDx] may be more significant bits (MSBs) of an address while burst portion[1:0] may be the least significant bits (LSBs) of an address.

Referring to FIG. 29B, a base address [ADDx] may be extracted from a write address value with an address extraction operation 2977 and stored in location [Base Add]

corresponding to the port requesting the write operation. Such a base address value [ADDx] may be applied to burst access memory device 2990 as a base address for a burst read access (e.g., starting at [ADDx]:[00], and bursting through [ADDx]:01], [ADDx]:10], [ADDx]:11]). In an alternate embodiment, a base address may be applied from location Ext. Add. Reg.

Referring still to FIG. 29B, in response to the base address, a burst sequence of data (Da, Db, Dc, Dd) corresponding to the base address may be sequentially output from burst access memory device 2990 and stored in locations Dbrst1-4, respectively.

Referring to FIG. 29C, each of data locations DBrst1-4 may be conceptualized as corresponding to LSB values 00, 01, 10 and 11, respectively. As shown in FIG. 29C, a data unit corresponding to the LSBs of the write address may be modified to store the write data unit (Dz) according to such LSB. Thus, in the example shown, write data unit Dz may be written into location DBrst2, replacing data unit Db.

Referring to FIG. 29D, a base address [ADDx] may again be applied to burst access memory device 2990, but this time as a base address for a burst write access. As in the case of FIG. 29B, in an alternate embodiment, a base address may be applied from location Ext. Add. Reg. In response to such a write base address, a burst sequence of modified data (Da, Dz, Dc, Dd) corresponding to the base address may be sequentially written into burst access memory device 2990 from locations Dbrst1-4, respectively, of write access register 2999-0.

In this way, a multi-port memory device may burst read data from a memory portion in response to a write operation, modify one data unit of the burst, and then burst write the modified data back into the memory portion.

Referring now to FIGS. 30A to 30D, read operations for a multi-port memory device like that of FIG. 27 are shown in a sequence of block diagrams. FIGS. 30A to 30D show a multi-port memory device 3000 having a burst access memory portion 3090 and a read burst buffer 3099-1. Such sections may be like those shown as 2790 and 2799-1, respectively, in FIG. 27.

Referring to FIG. 30A, in response to a read operation, a read address ([ADDx]:[1:0]) may be received. The read address ([ADDx]:[1:0]) may be stored in storage location Ext. Add. Reg. corresponding to the port receiving the read request. As in the case of FIGS. 29A to 29D, a read address ([ADDx]:[1:0]) may include a base address portion [ADDx] and a burst portion[1:0].

Referring to FIG. 30B, a base address [ADDx] may be extracted from a read address value with an address extraction operation 3077, in the same or equivalent fashion, as described in FIG. 29B.

Referring to FIG. 30C, base address value [ADDx] may be applied to burst access memory portion 3090 as a base address for a burst read access. In an alternate embodiment, a base address may be applied from location Ext. Add. Reg. In response to the base address, a burst sequence of data (Da, Db, Dc, Dd) corresponding to the base address may be sequentially output from burst access memory device 3090 and stored in locations Dbrst1-4, respectively.

Referring to FIG. 30D, like FIGS. 29A to 29D, each of data locations DBrst1-4 may be conceptualized as corresponding to LSB values 00, 01, 10 and 11 respectively. As shown in FIG. 30D, a data unit corresponding to the LSBs of the read address may be selected for output by data selector circuit 3083. Thus, in the example shown, read data unit Dc may be output on the port requesting the read operation.

In this way, a multi-port memory device may burst read data from a memory portion in response to a read operation, but output one data unit of the burst based on a portion of the read address.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
a first integrated circuit (IC) portion having a memory array configured to store data units at respective storage locations, and burst access circuitry configured to sequentially access, through a single burst access, N related storage locations within the memory array, wherein N>1, the N related storage locations within the memory array comprise related addressed that are addressable based on a single base address, wherein the burst access circuitry is configured to sequentially access the N related storage locations and transfer the respective data unit at the respective storage location to a second IC portion responsive to the single base address in the single burst access; and
the second IC portion comprising a plurality of burst access registers coupled to the burst access circuitry, each burst access register having register locations to store at least N data units of the N related storage locations, and coupled to a corresponding port, of a plurality of ports of the second IC, by a single data unit access path, wherein a data bandwidth between the first IC portion and the second IC portion is greater than a sum of maximum data bandwidths of the plurality of ports, and wherein a first data transfer between one of the plurality of burst access registers and the first IC portion is according to the single burst access the respective ones of the data units corresponding to the N related storage locations within the memory array and a second data transfer between the one burst access register and at least one of the plurality of ports of the second IC portion is according to non-burst access of the respective one of the at least N data units stored in the one burst access register.

2. The integrated circuit device of claim 1, wherein the first IC portion includes memory registers connected to the memory array, and the burst access circuitry bursts data between the memory registers and the plurality of burst access registers.

3. The integrated circuit device of claim 1, wherein the integrated circuit device is a first-in-first-out (FIFO) memory device, wherein the plurality of burst access registers include a write burst buffer configured to receive data units one at a time via a write port, and a read burst buffer configured to output data units one at a time via a read port.

4. The integrated circuit device of claim 3, wherein the second IC portion further includes a FIFO control circuit that generates at least one write pointer that indicates locations to store an incoming write data unit in the write burst buffer and at least one read pointer that indicates locations to output a write data unit from the read burst buffer.

5. The integrated circuit device of claim 4, wherein the FIFO control circuit writes data in a sequential data burst into the memory array by activating the burst access circuitry in response to at least one predetermined write pointer value, and reads data in a sequential data burst from the memory array by activating the burst access circuitry in response to at least one predetermined read pointer value.

6. The integrated circuit device of claim 4, wherein the FIFO control circuit couples at least an initial data unit from the write port to the read port, bypassing the memory array, the initial data unit being a first data value being written to the FIFO memory device.

7. The integrated circuit device of claim 1, wherein the integrated circuit device is a multi-port random access memory (MPRAM) device having at least two access ports, and the plurality of burst access registers includes a write burst register corresponding to each access port, each write burst register including a write address store that stores a received write address, a write data store that stores a write data unit, and at least N write burst data stores that each store one data unit.

8. The integrated circuit device of claim 7, wherein the second IC portion further includes an MPRAM control circuit that modifies the data in one of the N write burst data stores in response to at least a portion of the received write address and the write data value.

9. The integrated circuit device of claim 8, wherein the MPRAM control circuit reads data in a sequential burst from the memory array to the at least N write burst data stores by activating the burst access circuitry in response to at least only a portion of the received write address, and writes data stored in the at least N write burst data stores by activating the burst access circuitry in response to the data in one of the N write burst data stores being modified.

10. The integrated circuit device of claim 8, wherein the plurality of burst access registers further includes a read burst register corresponding to each access port, each read burst register including a read address store that stores a received read address, and at least N read burst data stores that each store one data unit, and the MPRAM control circuit reads data in a sequential burst from the memory array to the at least N read burst data stores by activating the burst access circuitry in response to at least only a portion of the received read address, and outputs the data unit stored in one of the N read burst data stores in response to a portion of the received read address.

11. The integrated circuit device of claim 1, wherein the first IC portion and second IC portion are part of a same monolithic integrated circuit.

12. The integrated circuit device of claim 1, wherein the first IC portion is part of a first substrate, the second IC portion is part of a second substrate, and the first substrate and second substrate are electrically connected to one another in a same IC package.

13. A multi-port memory device comprising:
a memory integrated circuit (IC) portion having burst access circuits configured to access, through a burst access operation, storage locations of a memory array in sequential bursts of data units to at least two related address locations of the memory array responsive to a base address of the memory array and transfer the respective data units at the respective storage locations to a multi-port IC portion;
the multi-port IC portion comprising a plurality of ports for communication with devices external to the multi-port memory device; and
at least one burst access register corresponding to each of the plurality of ports having a plurality of burst storage locations, each burst access register transferring data between its corresponding port and burst storage locations, wherein a first data transfer between one burst access register and one the plurality of ports is according to a non-burst access of the respective one the data units at the one burst access register, and wherein a second data transfer the one burst access register and the memory IC portion is according to a burst access of the respective one of the data units at the one burst access register to a respective one of the the at least two related address locations, wherein a bandwidth between the memory IC portion and the multi-port IC portion is greater than a sum of a maximum bandwidth of each of the plurality of ports.

14. The multi-port memory device of claim 13, wherein the multi-port IC portion comprises more non-programmable circuits than programmable circuits.

15. The multi-port memory device of claim 13, wherein the multi-port IC portion comprises programmable circuits configurable to provide the at least one burst access register in response to configuration information.

16. The multi-port memory device of claim 13, wherein the memory IC portion comprises a static random access memory IC having a write data path separate from a read data path; and the multi-port IC portion comprises a field programmable gate array IC.

17. A method comprising:
transferring data, by burst access circuits, between a memory cell array of a memory integrated circuit (IC) portion and burst access registers within a separate multi-port IC portion in burst accesses transfers of N data units each of the N data units to respective ones of sequential locations within the memory cell array, based on a single base address of the memory cell array, wherein N>1 and each burst access register is configured to store the N data units;
servicing at least a portion of a read request concurrently with at least a portion of a write request; and
transferring the N data units between access ports of the multi-port IC portion and the burst access registers in non-burst transfers of single data units of the N data units, wherein a data bandwidth between the memory IC portion and the multi-port IC portion is greater than a sum of maximum data bandwidths of the access ports.

18. The method of claim 17, wherein the memory IC portion and multi-port IC portion comprise a first-in-first-out (FIFO) IC device, and the burst access registers include a write burst register and a read burst register, the method including:
receiving at least two write data units in the write burst register with single data unit transfers from a write port, and burst writing the at least two write data units to locations in the memory cell array; and burst reading at least two read data units from locations in the memory cell array to the read burst register, and outputting the at least two read data units to a read port in separate single data units transfers.

19. The method of claim 17, wherein the memory IC portion and multi-port IC portion comprise a multi-port random access (MPRAM) IC device, and the burst access registers include a write burst register and a read burst register for each of multiple ports on the multi-port IC portion, the method including:

receiving a write data unit and write address, burst reading a sequence of data units from the memory cell array corresponding to a portion of the write address, modifying one of the data units in the sequence to the write data unit to create a modified sequence of data units, and burst writing the modified sequence of data units into the memory cell array according to the portion of the write address; and receiving a read address, burst reading a read sequence of data units from the memory cell array corresponding to a portion of the read address, outputting one data unit in the read sequence in a non-burst transfer.

20. The method of claim 17, further including programming programmable logic circuits of the multi-port IC portion to form at least the burst access registers.

* * * * *